US012777160B2

(12) United States Patent
Kempf et al.

(10) Patent No.: US 12,777,160 B2
(45) Date of Patent: Oct. 27, 2026

(54) RECURSIVE IMAGE COMPRESSION

(71) Applicant: TEXAS INSTRUMENTS INCORPORATED, Dallas, TX (US)

(72) Inventors: Jeffrey Kempf, Dallas, TX (US); Jonathan Lucas, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 503 days.

(21) Appl. No.: 18/326,764

(22) Filed: May 31, 2023

(65) Prior Publication Data

US 2023/0412814 A1 Dec. 21, 2023

Related U.S. Application Data

(60) Provisional application No. 63/366,726, filed on Jun. 21, 2022.

(51) Int. Cl.
*H04N 19/136* (2014.01)
*G06F 18/231* (2023.01)
(Continued)

(52) U.S. Cl.
CPC ......... *H04N 19/136* (2014.11); *G06F 18/231* (2023.01); *G06T 7/90* (2017.01);
(Continued)

(58) Field of Classification Search
CPC .... H04N 19/136; H04N 1/644; H04N 19/126; H04N 19/176; H04N 19/186; H04N 19/593; H04N 19/91; H04N 19/94; H04N 19/96; H04N 19/70; H04N 19/124; H04N 19/184; H04N 19/189; G06F 18/231; G06T 7/90; G06T 9/20; G06T 9/40; G06T 9/008; G06V 10/56; H03M 7/3059
See application file for complete search history.

(56) References Cited

U.S. PATENT DOCUMENTS 9,986,135 B2 5/2018 Kempf
2016/0156933 A1* 6/2016 Kalevo .................. H03M 7/46 375/240.18
(Continued)

FOREIGN PATENT DOCUMENTS

WO WO-2021195628 A1 * 9/2021 ............ H04N 19/96

OTHER PUBLICATIONS

Celebi, M. Emre, Quan Wen, and Sae Hwang. "An effective real-time color quantization method based on divisive hierarchical clustering." Journal of Real-Time Image Processing 10.2 (2015): 329-344. (Year: 2015).*
(Continued)

*Primary Examiner* — Sumati Lefkowitz
*Assistant Examiner* — Ryan P Potts
(74) *Attorney, Agent, or Firm* — Michael T. Gabrik; Charles F. Koch

(57) ABSTRACT

A system includes a controller configured to: obtain palette keys for an image; and for each of a plurality of sub-blocks of the image, obtain a compressed set of palette keys responsive to gradient analysis and entropy analysis. The system also includes a spatial light modulator coupled to the controller and configured to project an image responsive to the palette keys and the compressed set of palette keys.

19 Claims, 23 Drawing Sheets

(51) Int. Cl.

| | |
|---|---|
| ***G06T 7/90*** | (2017.01) |
| ***G06T 9/00*** | (2006.01) |
| ***G06T 9/20*** | (2006.01) |
| ***G06T 9/40*** | (2006.01) |
| ***G06V 10/56*** | (2022.01) |
| ***H03M 7/30*** | (2006.01) |
| ***H04N 1/64*** | (2006.01) |
| ***H04N 19/124*** | (2014.01) |
| ***H04N 19/126*** | (2014.01) |
| ***H04N 19/176*** | (2014.01) |
| ***H04N 19/186*** | (2014.01) |
| ***H04N 19/189*** | (2014.01) |
| ***H04N 19/593*** | (2014.01) |
| ***H04N 19/91*** | (2014.01) |
| ***H04N 19/94*** | (2014.01) |
| ***H04N 19/96*** | (2014.01) |

(52) U.S. Cl.

CPC ................ *G06T 9/008* (2013.01); *G06T 9/20* (2013.01); *G06T 9/40* (2013.01); *G06V 10/56* (2022.01); *H03M 7/3059* (2013.01); *H04N 1/644* (2013.01); *H04N 19/124* (2014.11); *H04N 19/126* (2014.11); *H04N 19/176* (2014.11); *H04N 19/186* (2014.11); *H04N 19/189* (2014.11); *H04N 19/593* (2014.11); *H04N 19/91* (2014.11); *H04N 19/94* (2014.11); *H04N 19/96* (2014.11)

(56) References Cited

U.S. PATENT DOCUMENTS

| | | | | |
|---|---|---|---|---|
| 2017/0109898 | A1* | 4/2017 | Koylazov | G06T 11/10 |
| 2017/0142426 | A1* | 5/2017 | Kempf | H04N 1/644 |
| 2019/0272333 | A1* | 9/2019 | Siddiqi | G06V 10/761 |
| 2019/0320090 | A1* | 10/2019 | Popa | H04N 1/413 |
| 2022/0044446 | A1 | 2/2022 | Kempf et al. | |
| 2022/0353540 | A1* | 11/2022 | Jhu | H04N 19/103 |

OTHER PUBLICATIONS

Orchard, Michael T., and Charles A. Bouman. "Color quantization of images." IEEE transactions on signal processing 39.12 (1991): 2677-2690. (Year: 1991).*

Domanski, Marek, and Maciej Bartkowiak. "Compression." The colour image processing handbook. Boston, MA: Springer US, 1998. 242-304. (Year: 1998).*

Pu, Wei, et al. "Palette mode coding in HEVC screen content coding extension." IEEE Journal on Emerging and Selected Topics in Circuits and Systems 6.4 (2016): 420-432. (Year: 2016).*

Chang, Chuo-Ling, et al. "Direction-adaptive partitioned block transform for color image coding." IEEE Transactions on Image Processing 19.7 (2010): 1740-1755. (Year: 2010).*

* cited by examiner

1500

ORIGINAL DOMINANT GRADIENT DIRECTIONS

1600

5-BIT KEYS, BEFORE GRADIENT COMPRESSION

| | | | | | | | | | | | | | | | |
|---|---|---|---|---|---|---|---|---|---|---|---|---|---|---|---|
| 17 | 20 | 19 | 19 | 19 | 18 | 17 | 17 | 17 | 15 | 15 | 15 | 15 | 15 | 15 | 15 |
| 22 | 22 | 22 | 22 | 22 | 21 | 19 | 18 | 18 | 17 | 14 | 14 | 15 | 15 | 15 | 15 |
| 22 | 23 | 23 | 23 | 22 | 22 | 20 | 19 | 16 | 13 | 11 | 10 | 10 | 10 | 11 | 13 |
| 22 | 23 | 23 | 22 | 20 | 19 | 17 | 13 | 11 | 13 | 14 | 11 | 8 | 7 | 6 | 7 |
| 21 | 22 | 21 | 19 | 17 | 13 | 13 | 17 | 13 | 10 | 7 | 5 | 3 | 2 | 2 | 2 |
| 21 | 20 | 19 | 17 | 13 | 9 | 14 | 14 | 8 | 7 | 5 | 6 | 3 | 2 | 2 | 2 |
| 25 | 21 | 18 | 15 | 11 | 13 | 7 | 6 | 12 | 16 | 6 | 9 | 3 | 2 | 2 | 2 |
| 30 | 26 | 20 | 16 | 11 | 8 | 5 | 8 | 27 | 25 | 10 | 10 | 6 | 5 | 2 | 2 |
| 29 | 26 | 25 | 16 | 8 | 5 | 6 | 12 | 26 | 30 | 27 | 9 | 16 | 26 | 9 | 9 |
| 31 | 31 | 29 | 27 | 16 | 6 | 7 | 10 | 26 | 30 | 30 | 16 | 12 | 14 | 12 | 13 |
| 30 | 28 | 29 | 27 | 27 | 10 | 10 | 14 | 26 | 24 | 30 | 30 | 27 | 12 | 13 | 23 |
| 29 | 30 | 31 | 28 | 14 | 14 | 16 | 16 | 14 | 17 | 24 | 23 | 23 | 23 | 23 | 23 |
| 30 | 31 | 30 | 30 | 28 | 27 | 27 | 16 | 16 | 21 | 23 | 22 | 22 | 23 | 23 | 20 |
| 30 | 30 | 30 | 30 | 29 | 30 | 29 | 26 | 16 | 18 | 19 | 20 | 22 | 22 | 20 | 18 |
| 30 | 31 | 30 | 30 | 27 | 29 | 27 | 30 | 24 | 19 | 22 | 21 | 20 | 18 | 17 | 17 |
| 27 | 31 | 30 | 30 | 27 | 27 | 30 | 30 | 30 | 24 | 20 | 19 | 18 | 17 | 17 | 17 |

FIG. 16A

1610

5-BIT KEYS, AFTER GRADIENT COMPRESSION

| | | | | | | | | | | | | | | | |
|---|---|---|---|---|---|---|---|---|---|---|---|---|---|---|---|
| 17 | 18 | 18 | 19 | 19 | 18 | 18 | 17 | 17 | 16 | 15 | 15 | 15 | 15 | 15 | 15 |
| 22 | 22 | 22 | 22 | 22 | 21 | 19 | 18 | 18 | 15 | 15 | 14 | 15 | 15 | 15 | 15 |
| 22 | 23 | 23 | 23 | 22 | 22 | 21 | 19 | 16 | 14 | 13 | 10 | 10 | 10 | 12 | 13 |
| 22 | 22 | 22 | 22 | 20 | 18 | 15 | 13 | 11 | 13 | 13 | 11 | 8 | 8 | 7 | 7 |
| 21 | 20 | 20 | 19 | 17 | 13 | 11 | 17 | 13 | 11 | 6 | 6 | 3 | 2 | 2 | 2 |
| 21 | 20 | 18 | 17 | 13 | 11 | 15 | 14 | 8 | 8 | 8 | 6 | 3 | 3 | 2 | 2 |
| 25 | 21 | 18 | 15 | 11 | 13 | 11 | 6 | 12 | 11 | 9 | 9 | 3 | 3 | 2 | 2 |
| 30 | 25 | 21 | 16 | 11 | 8 | 5 | 8 | 27 | 25 | 11 | 10 | 6 | 5 | 2 | 2 |
| 29 | 27 | 26 | 16 | 8 | 5 | 6 | 11 | 26 | 30 | 22 | 9 | 16 | 14 | 11 | 9 |
| 31 | 29 | 27 | 26 | 10 | 9 | 9 | 11 | 26 | 25 | 30 | 22 | 12 | 12 | 13 | 13 |
| 30 | 31 | 28 | 27 | 27 | 12 | 12 | 13 | 26 | 25 | 24 | 30 | 27 | 12 | 18 | 23 |
| 29 | 30 | 31 | 28 | 14 | 14 | 16 | 16 | 14 | 17 | 24 | 23 | 23 | 23 | 23 | 23 |
| 30 | 31 | 30 | 30 | 28 | 29 | 27 | 16 | 16 | 17 | 23 | 23 | 22 | 23 | 23 | 20 |
| 30 | 31 | 30 | 30 | 29 | 29 | 29 | 27 | 16 | 18 | 19 | 20 | 22 | 21 | 21 | 19 |
| 30 | 31 | 30 | 30 | 27 | 30 | 29 | 29 | 24 | 22 | 19 | 21 | 20 | 19 | 18 | 17 |
| 27 | 31 | 30 | 30 | 27 | 27 | 30 | 30 | 30 | 24 | 21 | 19 | 18 | 17 | 17 | 17 |

FIG. 16B

ABSOLUTE DIFFERENCES

| | | | | | | | | | | | | | | | |
|---|---|---|---|---|---|---|---|---|---|---|---|---|---|---|---|
| 0 | 2 | 1 | 0 | 0 | 0 | 1 | 0 | 0 | 1 | 0 | 0 | 0 | 0 | 0 | 0 |
| 0 | 0 | 0 | 0 | 0 | 0 | 0 | 0 | 0 | 2 | 1 | 0 | 0 | 0 | 0 | 0 |
| 0 | 0 | 0 | 0 | 0 | 0 | 1 | 0 | 0 | 1 | 2 | 0 | 0 | 0 | 1 | 0 |
| 0 | 1 | 1 | 0 | 0 | 1 | 2 | 0 | 0 | 0 | 1 | 0 | 0 | 1 | 1 | 0 |
| 0 | 2 | 1 | 0 | 0 | 0 | 2 | 0 | 0 | 1 | 1 | 1 | 0 | 0 | 0 | 0 |
| 0 | 0 | 1 | 0 | 0 | 2 | 1 | 0 | 0 | 1 | 3 | 0 | 0 | 1 | 0 | 0 |
| 0 | 0 | 0 | 0 | 0 | 0 | 4 | 0 | 0 | 5 | 3 | 0 | 0 | 1 | 0 | 0 |
| 0 | 1 | 1 | 0 | 0 | 0 | 0 | 0 | 0 | 0 | 1 | 0 | 0 | 0 | 0 | 0 |
| 0 | 1 | 1 | 0 | 0 | 0 | 0 | 1 | 0 | 0 | 5 | 0 | 0 | 12 | 2 | 0 |
| 0 | 2 | 2 | 1 | 6 | 3 | 2 | 1 | 0 | 5 | 0 | 6 | 0 | 2 | 1 | 0 |
| 0 | 3 | 1 | 0 | 0 | 2 | 2 | 1 | 0 | 1 | 6 | 0 | 0 | 0 | 5 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 2 | 0 | 0 | 0 | 4 | 0 | 1 | 0 | 0 | 0 | 0 |
| 0 | 1 | 0 | 0 | 0 | 1 | 0 | 1 | 0 | 0 | 0 | 0 | 0 | 1 | 1 | 1 |
| 0 | 0 | 0 | 0 | 0 | 1 | 2 | 1 | 0 | 3 | 3 | 0 | 0 | 1 | 1 | 0 |
| 0 | 0 | 0 | 0 | 0 | 0 | 0 | 0 | 0 | 0 | 1 | 0 | 0 | 0 | 0 | 0 |

SUB-BLOCKS WHERE LOW ENTROPY ENCODING PRODUCES MIN ERROR

1800

1900

GATHERED PALETTES

| DIMMEST | | | | | | FURTHEST FROM DIMMEST | |
|---|---|---|---|---|---|---|---|
| 24 | 44 | 61 | 81 | 73 | 104 | 85 | 113 |
| 15 | 31 | 41 | 55 | 70 | 68 | 90 | 79 |
| 17 | 28 | 37 | 48 | 71 | 57 | 91 | 68 |

CLUSTER VARIANCES & PHOTOPIC-WEIGHTED VARIANCES

| | | | | | | | | | | | | | | | |
|---|---|---|---|---|---|---|---|---|---|---|---|---|---|---|---|
| 3338 | | 1362 | | 3859 | | 18770 | | 3904 | | 9822 | | 12161 | | 13229 | |
| 1277 | 12579 | 825 | 6671 | 1485 | 15249 | 2538 | 52683 | 1064 | 14506 | 3491 | 37659 | 4095 | 46633 | 2402 | 40255 |
| 795 | | 647 | | 1591 | | 4991 | | 2442 | | 4051 | | 5931 | | 4189 | |

FIG. 19

AFTER ASSIGNMENT TO 2 INITIAL PARENTS

GATHERED PALETTES

| | | | | | | | |
|---|---|---|---|---|---|---|---|
| 24 | 44 | 61 | 81 | 73 | 104 | 85 | 113 |
| 15 | 31 | 41 | 55 | 70 | 68 | 90 | 79 |
| 17 | 28 | 37 | 48 | 71 | 57 | 91 | 68 |

CLUSTER VARIANCES & PHOTOPIC-WEIGHTED VARIANCES

| | | | | | | | | | | | | | | | |
|---|---|---|---|---|---|---|---|---|---|---|---|---|---|---|---|
| 3338 | | 1362 | | 3859 | | 18770 | | 3904 | | 9822 | | 12161 | | 13229 | |
| 1277 | 12579 | 825 | 6671 | 1485 | 15249 | 2538 | 52683 | 1064 | 14506 | 3491 | 37659 | 4095 | 46633 | 2402 | 40255 |
| 795 | | 647 | | 1591 | | 4991 | | 2442 | | 4051 | | 5931 | | 4189 | |

AFTER 4 DATA PASSES OF PARENT CLUSTERING

PARENT PALETTES

| | |
|---|---|
| 43 | 94 |
| 29 | 73 |
| 27 | 66 |

PARENT CLUSTER VARIANCES & PHOTOPIC-WEIGHTED VARIANCES

| | | | |
|---|---|---|---|
| 8559 | | 57886 | |
| 3587 | 34499 | 13590 | 191736 |
| 3033 | | 21604 | |

2000

FIG. 20

RECURSIVE IMAGE COMPRESSION

CROSS REFERENCE TO RELATED APPLICATION

The present application claims priority to U.S. Provisional Application No. 63/366,726, titled "Recursive Clustering Compression", filed on Jun. 21, 2022, which is hereby incorporated by reference in its entirety.

BACKGROUND

In general, digital images require significant memory for storage and require significant time and bandwidth for transmission. Digital images are often compressed to reduce storage requirements and to reduce transmission time and bandwidth. There are lossless compression techniques and lossy techniques. Typically, when a guaranteed compression ratio is needed then lossy techniques are used. There are many lossy compression algorithms. Many of those algorithms require a substantial amount of time and processor power, both to compress and to decompress. For example, some lossy compression algorithms are based on computation extensive transforms such as Fast Fourier Transform, Discrete Cosine Transform, or Wavelet Transforms.

SUMMARY

In an example, a system includes a controller configured to: obtain palette keys for an image; and, for each of a plurality of sub-blocks of the image, obtain a compressed set of palette keys responsive to gradient analysis and entropy analysis. The system also includes a spatial light modulator coupled to the controller and configured to project an image based on the palette keys and the compressed set of palette keys.

In another example, a controller includes: a processor; and memory coupled to or included with the processor. The memory stores compression instructions that, when executed, cause the processor to: obtain an image; perform parent-child cluster compression on initial pixel colors of the image to obtain palette keys; for each of a plurality of sub-blocks of the image, obtain a compressed set of palette keys responsive to gradient analysis and entropy analysis; and output a compressed image based on the palette keys and the compressed set of palette keys.

In yet another example, a method includes: obtaining, by a controller, the image; performing, by the controller, parent-child cluster compression on initial colors of the image to obtain palette keys; for each of a plurality of sub-blocks of the image, obtain a compressed set of palette keys responsive to gradient analysis and entropy analysis; and outputting, by the controller, a compressed image based on the palette keys and the compressed set of palette keys.

BRIEF DESCRIPTION OF THE DRAWINGS

FIG. 16A is a diagram of palette key values before gradient-based compression for the portion of the image in FIG. 15 in accordance with various examples.

FIG. 16B is a diagram of palette key values after gradient-based compression for the portion of the image in FIG. 15 in accordance with various examples.

FIGS. 19 to 23 are tables showing palette compression analysis metrics in accordance with various examples.

DETAILED DESCRIPTION

Figure 1A:
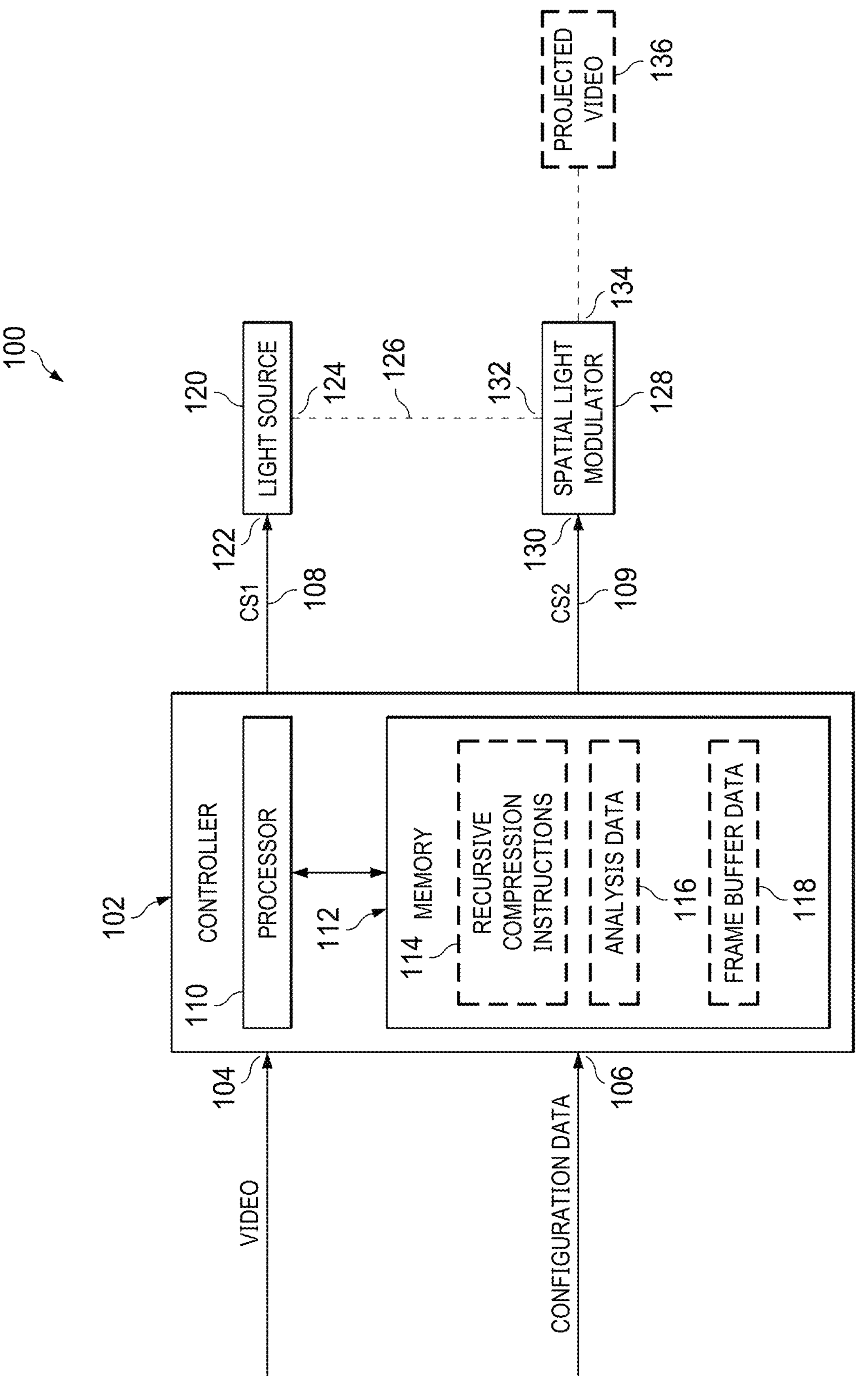
FIG. 1A is a block diagram of a system in accordance with various examples.

The same reference numbers or other reference designators are used in the drawings to designate the same or similar features. Such features may be the same or similar either by function and/or structure.

Parent-child cluster (PCC) compression, as described herein, utilizes a clustering technique to reduce the dimensionality of the data. Because most red-green-blue (RGB) data in a localized region of an image or video is naturally clustered, the PCC compression technique produces little to no observable loss of information. PCC compression stays entirely in the spatial domain, so the compute load requirements are much lower than algorithms that use transform encoding techniques, which translates to lower power consumption. Also, decompression of PCC compression encoded images uses a look-up table (LUT). The LUT may store pixel key assignments, where the key determines the appropriate palette or cluster centroid to which a pixel is assigned.

In some examples, the PCC compression reduces quantization error among clustered pixels. Pixels are grouped into clusters based on their location in RGB space. The initial clusters are known as parents. Some or all of these parent clusters are then split into smaller clusters known as child clusters. Also, PCC compression incorporates a key encoding scheme that is tailored to the human visual system, providing high fidelity in low entropy regions and high dynamic range in high entropy regions.

In some examples, PCC compression takes pixels that make up an original image or part of an original image and maps those pixels in RGB space. Then, PCC compression groups those pixels into various clusters, based on the pixels' locations in RGB space. After the pixels have been grouped into clusters, the pixels in a given cluster are each represented by a single RGB value, which is located at the centroid of the given cluster. Additional steps are performed during compression and decompression to further improve the results of PCC compression. In some examples, PCC compression produces a compressed version of an original image.

In some examples, PCC compression is part of a recursive compression process. In some examples, the recursive compression process may include PCC compression, palette key compression for sub-blocks of an image based on gradient analysis and entropy analysis, extension of palette key compression for one sub-block of an image to other sub-blocks, and/or other compression options. The compression techniques described herein compress data in RGB space to produce a compressed image. However, other suitable types of data can be compressed using the techniques herein. In some examples, the recursive compression process described herein compresses a collection of N objects to a number less than N by analyzing an error metrics. In such examples, the objects are RGB pixels and the error metric may be maximum absolute distance (described below), but other objects and other error metrics are useful in other examples.

FIG. 1A is a block diagram of a system 100 in accordance with various examples. In some examples, system 100 is a projector, for example a traditional projector, an augmented reality (AR) display, a virtual reality (VR) display, a smart headlight, a heads up display (HUD), automotive ground projection, a LIDAR unit, a lithography unit, 3D-printer, a spectroscopy display, a 3D display, or another type of projector. The example system 100 is not intended to be limiting and the recursive compression techniques described herein may be used is any other system to compress images and reduce memory footprint. As shown, system 100 includes a controller 102, a light source 120, and a spatial light modulator 128. Controller 102 has a first input 104, a second input 106, a first output 108, and a second output 109. The light source 120 has an input 122 and an optical output 124. The spatial light modulator 128 has an input 130, an optical input 132, and an optical output 134.

In the example of FIG. 1A, controller 102 includes a processor 110 and a memory 112. The processor 110 can be a central processing unit (CPU), a graphics processing unit (GPU), or a specialized processor or controller programmed to perform recursive compression operations. In different examples, the processor 110 may include a processing pipeline, buffering, and control logic for performing recursive compression operations. Also, the processor 110 may include multiple processors, controllers, or engines to perform recursive compression operations. In one example, the processor 110 uses buffering and logic with a pipelined data path architecture to perform the recursive compression operations described herein. When processing a block of pixels, calculations on one pixel generally finish before calculations on another pixel begins. Therefore, a straightforward pipelined data path architecture can have difficulties performing PCC compression or other recursive compression operations, as no two pieces of data from the same block are in the pipeline simultaneously. However, data from different blocks can be in the pipeline simultaneously. By adding buffering and logic around the pipeline, the processing of multiple blocks can be interleaved using the same pipeline logic.

Interleaving all blocks in a single pipeline can present some limitations, as the single pipeline becomes a bandwidth bottleneck. Duplicating the pipeline increases bandwidth, but at the cost of logic area. In an example, the processing, buffering, and control logic are bundled into a PCC engine. A processing system can include multiple processing engines. The number of processing engines and interleaving factor can be varied to ensure that an available recursive compression bandwidth is in line with the recursive compression bandwidth used by the recursive compression tasks being performed. In one example, eight processing engines could be used, with each processing engine interleaving 32 blocks.

The memory 112 can include read-only-memory (ROM), random access memory (RAM), electrically erasable programmable read-only memory (EEPROM), flash memory, and/or other non-transitory computer readable memory types. In some examples, the memory 112 store recursive compression instructions 114, analysis data 116, and frame buffer data 118. The memory 112 may also store image data, pixel data, and any other data used by processor 110 to perform recurve compression operations or results. In some examples, the memory 112 may store a key for each pixel of an image, where the key denotes the palette to which each pixel is assigned. In some examples, the memory 112 is configured to store a control bit for a sub-block of pixels, where the control bit indicates a type of encoding for the sub-block.

As shown, the first input 104 of the controller 102 receives video input. The second input 106 of controller 102 receives configuration data. The first output 108 of controller 102 is coupled to the input 122 of the light source 120. The second output 109 of controller 102 is coupled to the input 130 of the spatial light modulator 128. The optical output 124 of the light source 120 is coupled to optical input 132 of the spatial light modulator 128. The optical output 134 of the spatial light modulator 128 provides a projected video 136.

In some examples, controller 102 is configured to: receive video at its first input 104; receive configuration at its second input 106; provide a first control signal (CS1) at its first output 108 responsive to the video and the configuration data; and provide a second control signal (CS2) at its second output 109 responsive to the video and the configuration data. In some examples, the configuration data includes a video resolution configuration, a high-frequency sampling order, and/or other configuration options. In some examples, CS1 is a light intensity control signal for the light source 120. The light source 120 is configured to provide light 126 at its optical output 124 responsive to CS1. In some examples, CS2 includes a compressed image for the spatial light modulator 128. In some examples, the spatial light modulator 128 is configured to provide a projected video 136 responsive to the light 126 and CS2.

In some examples, the processor 110 determines CS2 based on recursive compression of images of the video. Such recursive compression of images of the video is based on instructions and data stored in the memory 112. Example instructions and data of the memory 112 include the recursive compression instructions 114, the analysis data 116, and the frame buffer data 118.

In some examples, execution of the recursive compression instructions 114 results in the analysis data 116 (e.g., PCC analysis data, gradient analysis data, entropy analysis data). The analysis data 116 is stored and analyzed during each iteration of the processor 110 executing the recursive compression instructions 114. In some examples, the final results of the recursive compression instructions 114 may include compressed palette keys and/or other data used to encode the frame buffer data 118. In some examples CS2 includes or is based on the frame buffer data 118. In some examples, recursive compression operations are performed by another integrated circuit (IC) (e.g., an upstream IC such as the IC 152 in FIG. 1B) and the compression results are sent to the controller 102. In such examples, the controller 102 may transfer and/or store the compression results. As part of display operations (performed upon receipt of compression results or later), the controller 102 may perform decompression operations. Compared to the original image (before recursive compression is performed), a decompressed image may be fully decompressed or partially decompressed. In different examples, the frame buffer data 118 may include the compression results or decompression results. Likewise, CS2 may include the compression results or the decompression results. When another IC performs the recursive compression operations, the compression results save bandwidth and power on the interface between the other IC (not shown) and the controller 102. In other examples, the controller 102 may perform recursive compression, compression results transfers, and/or decompression internally. In such examples, the recursive compression reduces the bandwidth of internal video transfers and/or the memory footprint of image/video storage for the controller 102.

In some examples, a system includes a controller (e.g., the controller 102 or its related processor 110); and a spatial light modulator (e.g., the spatial light modulator 128) coupled to the controller. The controller is configured to (e.g., by execution of the recursive compression instructions 114): obtain palette keys for an image; and, for each of a plurality of sub-blocks of the image, obtain a compressed set of palette keys responsive to gradient analysis and entropy analysis. The spatial light modulator is configured to project an image based on the palette keys and the compressed set of palette keys.

In some examples, the controller is further configured to perform gradient analysis for each sub-block by: sampling the palette keys along each of a plurality of gradients; obtaining an interpolation result for each of the sampled palette keys and respective gradients; and determining a gradient direction of interpolation results that minimizes an error metric. In some examples, the controller is further configured to determine the error metric based on a sum of absolute difference of interpolation results along a gradient relative to the palette keys. In some examples, the controller is further configured to determine the error metric based on a maximum absolute difference of interpolation results along a gradient relative to the palette keys.

In some examples, the controller is further configured to perform entropy analysis for each sub-block by: identifying areas along the gradient direction having an entropy below a threshold as low-entropy areas; and identifying areas along the gradient direction having an entropy above the threshold as high-entropy areas. In some examples, the controller is further configured to: apply the palette keys to the high-entropy areas; and apply the compressed set of palette keys to the low-entropy areas, the compressed set of palette keys based on a first set of bits that identify colors of the compressed set of palette keys, a second set of bits that identify a number of colors per sub-block, and a third set of bits that identify the gradient direction.

In some examples, the controller is further configured to obtain the palette keys by: performing parent-child cluster compression on initial pixel colors of the image; and reducing the initial pixel colors to the palette keys responsive to the parent-child cluster compression. In some examples, the controller is configured to selectively apply at least some of the compressed set of palette keys for one of the plurality of sub-blocks to another portion of the image.

In some examples, a controller includes: a processor (e.g., the processor 110); and memory (e.g., the memory 112) coupled to or included with the processor. The memory stores compression instructions (e.g., the recursive compression instructions 114) that, when executed, cause the processor to: obtain an image; perform parent-child cluster compression on initial pixel colors of the image to obtain palette keys; for each of a plurality of sub-blocks of the image, obtain a compressed set of palette keys responsive to gradient analysis and entropy analysis; and output a compressed image based on the palette keys and the compressed set of palette keys.

In some examples, compression instructions, when executed, further cause the processor to perform gradient analysis for each sub-block by: sampling the palette keys along each of a plurality of gradients; obtaining an interpolation result for each of the sampled palette keys and respective gradients; and determining a gradient direction of interpolation results that minimizes an error metric. In some examples, the compression instructions, when executed, further cause the processor to determine the error metric based on a summed absolute difference of interpolation results along a gradient relative to palette keys. In some examples, the compression instructions, when executed, further cause the processor to determine the error metric based on a maximum absolute difference of interpolation results along a gradient relative to the palette keys.

In some examples, compression instructions, when executed, further cause the processor to perform entropy analysis for each sub-block by: identifying areas along the gradient direction having an entropy below a threshold as low-entropy areas; and identifying areas along the gradient direction having an entropy above the threshold as high-entropy areas. In some examples, the compression instructions, when executed, further cause the processor to: apply the palette keys to the high-entropy areas; and apply the compressed set of palette keys to the low-entropy areas, the compressed set of palette keys based on a first set of bits that identify colors of the compressed set of palette keys, a second set of bits that identify a number of colors per sub-block, and a third set of bits that identify the gradient direction.

In some examples, compression instructions, when executed, further cause the processor to obtain the palette keys for the image by determining a nearest cluster for each pixel of the image based on a weighted absolute difference sum. In some examples, the compression instructions, when executed, further cause the processor to obtain the palette keys for the image by: determining a weighted variance for each of a plurality of clusters, the plurality of clusters including parent clusters and child clusters; and selectively splitting clusters based on a weighted variance improvement score that compares the weighted variance of each parent cluster with the average weighted variance of respective child clusters.

In some examples, compression instructions, when executed, further cause the processor to selectively apply at least some of the compressed set of palette keys for one of the plurality of sub-blocks to another portion of the image based on a recursive algorithm that includes: performing parent-child cluster compression based on a target sub-block size to compression ratio; performing palette key re-assignment responsive to the parent-child cluster compression; and applying a key compression that substitutes an initial palette list for the image with pixel data.

Figure 1B:
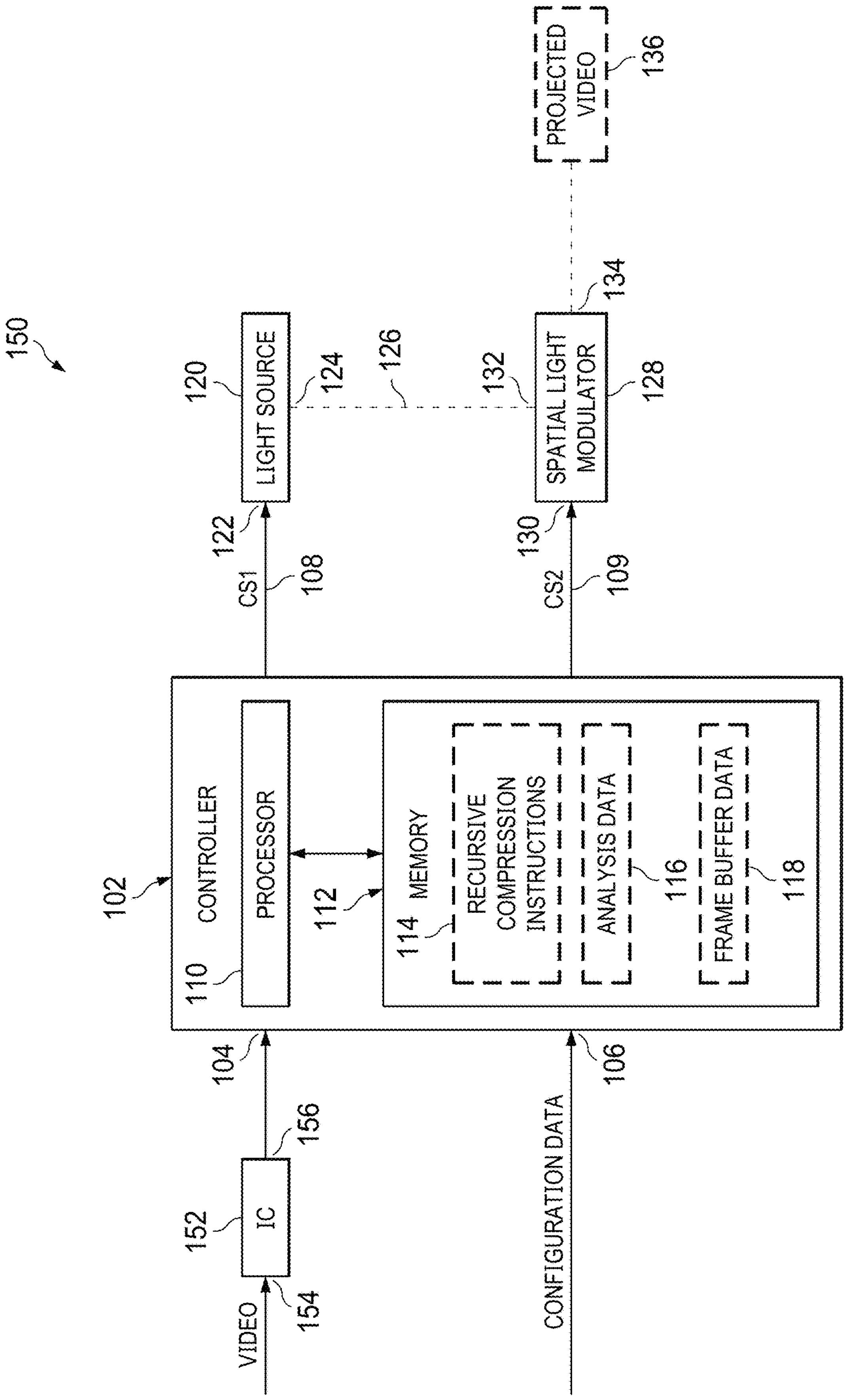
FIG. 1B is a block diagram of another system in accordance with various exam pies.

FIG. 1B is a block diagram of another system 150 in accordance with various examples. As shown, the system 150 includes the components of the system 100. In addition, the system 150 includes IC 152. The IC 152 has an input 154 and an output 156. The output 154 of the IC 152 is coupled to the first input 104 of the controller. The second terminal 156 is coupled to the controller 102. In some examples, the IC 152 may perform recursive image compression operations instead of, or in addition to, the controller 102. In such examples, the IC 152 may include a processor and a memory similar to the processor 110 and the memory 112 described for the controller 102. When the IC 152 perform recursive image compression, the compression results save bandwidth and power on the interface between IC 152 and the controller 102. As desired, the controller 102 may perform additional recursive compression, compression results transfers, and/or decompression internally. In such examples, the recursive compression performed by the controller 102 reduces the bandwidth of internal video transfers and/or the memory footprint of image/video storage for the controller 102.

include a processor and memory

Figure 2:
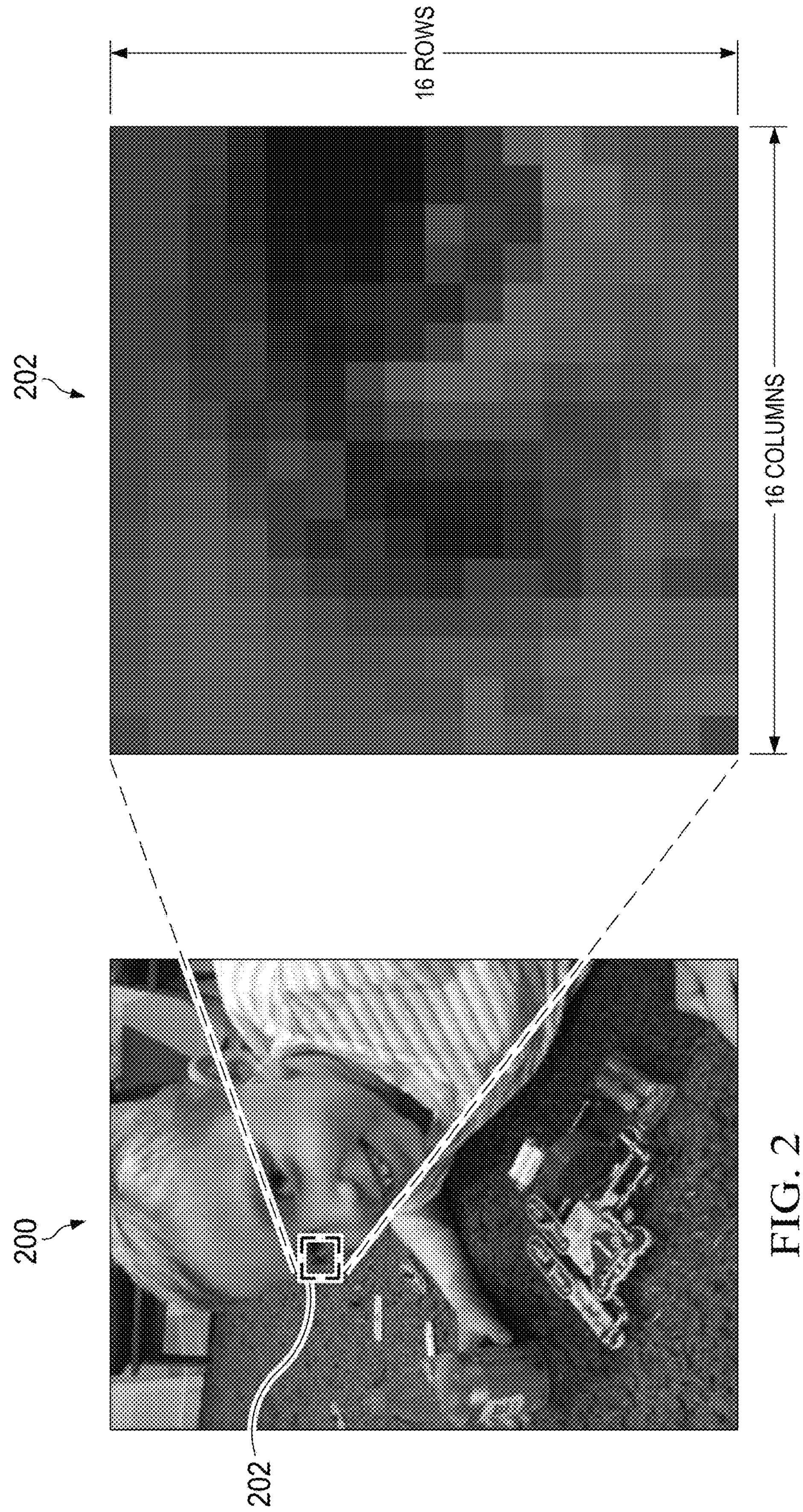
FIG. 2 is an image to be compressed in accordance with various examples.

FIG. 2 is an image 200 to be compressed in accordance with various examples. Image 200 is a raw image file with 30 bits per pixel. Sub-block 202 is a 16×16 block of pixels that is used to demonstrate recursive compression herein. Sub-block 202 is a closeup of an eye in image 200 and is composed of 16 rows and 16 columns, or 256 pixels. In some examples, recursive compression is a block-based compression algorithm. The block can be any size, and the example described herein will use the 16×16 sub-block 202. While the image in FIG. 2 appears herein as a black and white image, the original image that makes up FIG. 2 is a color image, and it is the color image that is compressed using PCC compression according to an example herein.

Figure 3:
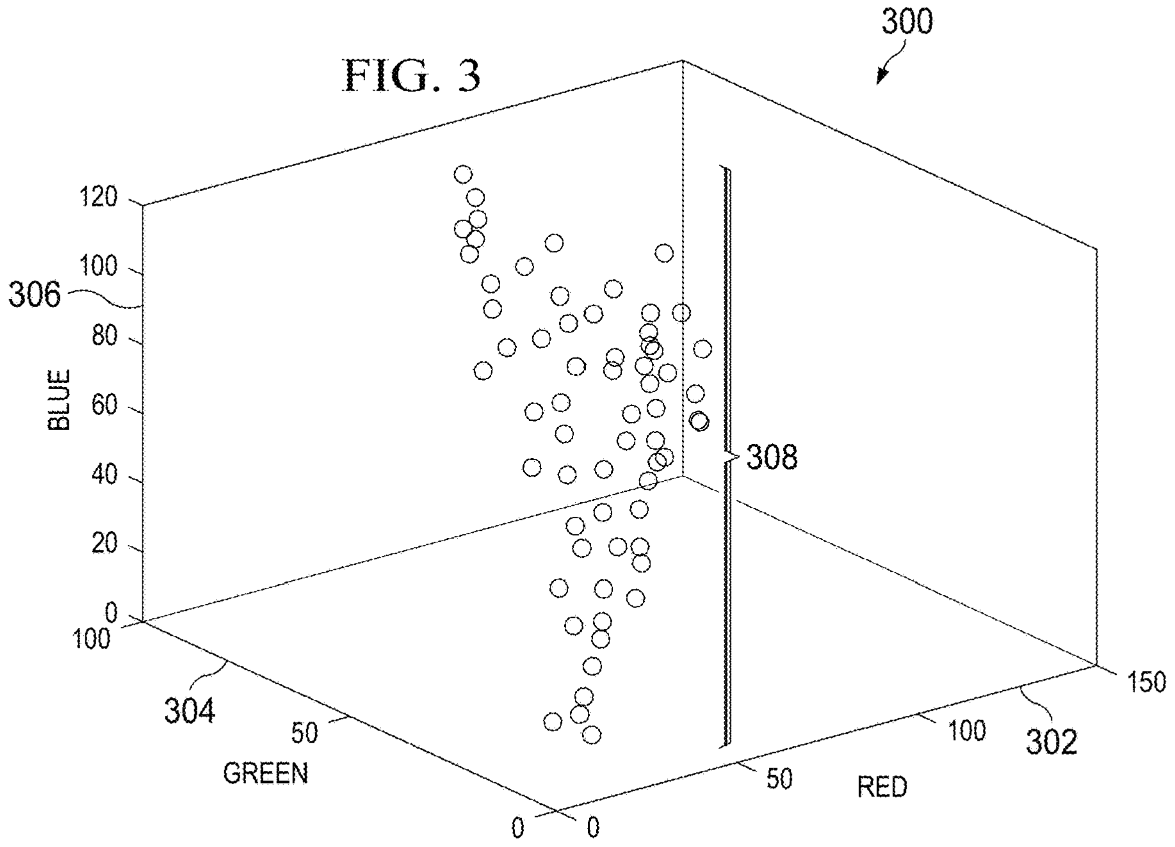
FIG. 3 is a graph of red-green-blue (RGB) value distribution for an image to be compressed in accordance with various examples.

FIG. 3 is a graph 300 of RGB value distribution for an image to be compressed in accordance with various examples. In some examples, the graph 300 corresponds to RGB values of the sub-block 202 of FIG. 2. In such case, each of the 256 pixels in sub-block 202 has an RGB value that denotes the pixel's color, and those 256 values are graphed on the x, y, and z-axes of the three-dimensional RGB space. Axis 302 represents the red value of the pixel. Axis 304 represents the green value of the pixel. Axis 306 represents the blue value of the pixel. Each circle on the graph represents one of the 256 pixels of sub-block 202. For simplicity, only a subset of the 256 pixels is shown in graph 300, rather than all 256 pixels. However, the techniques described herein may operate on all 256 pixels in this example. For purposes of discussion, it is assumed that the pixels 308 in graph 300 represent the collection of 256 sample pixels of the sub-block 202.

Figure 4:
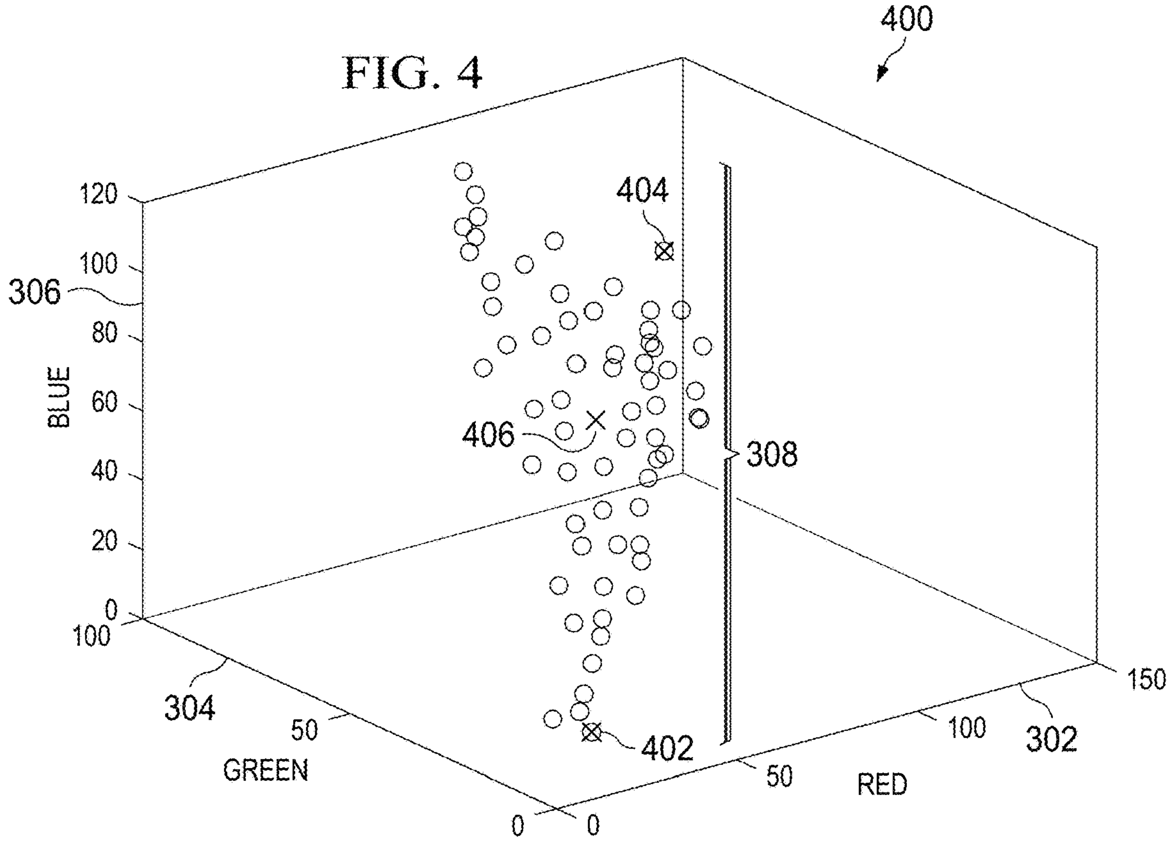
FIG. 4 is a graph of three cluster centroids during parent-child cluster (PCC) compression in accordance with various examples.

FIG. 4 is a graph 400 of pixels and three cluster centroids selected during PCC compression. A centroid is a location that marks the average of all of the pixels that make up a cluster. Each centroid has a coordinate in RGB space, just as each pixel does. The PCC algorithm begins with the 256 unique RGB values, which are represented in graphs 300 and 400 as pixels 308. The 256 unique RGB values include one value for each pixel 308 in the sub-block 202. To begin PCC compression, the dimensionality of the data is reduced. Reducing the dimensionality will transform the data from a higher-dimensional space to a lower-dimensional space, so the data can be compressed. The first step in PCC compression is to determine the dimmest pixel in the data set of pixels 308, the brightest pixel in the data set of pixels 308, and the mean of pixels 308 in the data set, all in RGB space. These three locations are then each used as an initial centroid for one of three clusters or palettes, which in turn are used to characterize each of the 256 pixels in the sub-block 202. In other examples, PCC compression may start with a first pixel furthest from mean, a second pixel at the mean, and a third pixel furthest from the first pixel. In still other examples, PCC compression may start with a first pixel furthest from median, a second pixel at the median, and a third pixel furthest from the first pixel. In other examples, other pixels are used for the initial pixels.

To find the dimmest pixel, luminance information is calculated for each of the 256 pixels of pixels 308. Luminance is determined for each pixel based on the RGB values of the pixel. Any appropriate formula is useful to determine luminance. After the luminance is determined for each pixel, a suitable minimum calculation is performed to select the pixel with the minimum luminance. Likewise, to find the brightest pixel, a suitable maximum calculation is performed to select the pixel with the maximum luminance.

To find the mean of the data set, a recursive mean calculation is used in one example. The RGB values of each of the pixels 308 can be summed, and then the sum is divided by the number of pixels (e.g., 256) to find the mean RGB value of the entire set of pixels 308. In graph 400, the dimmest pixel is the pixel at location 402 in this example. The brightest pixel is the pixel at location 404. Finally, the "X" near the center of graph 400 is the mean of the data set, and is labeled as location 406. In some examples, location 406 may not be located exactly at the location of one of the 256 pixels of pixels 308, because location 406 represents a mean value for the data set. These three locations (402, 404, 406) are called cluster centroids, or palette centroids. These three locations in RGB space are used as the three initial centroids, respectively, for three initial parent clusters of pixels that are used in PCC compression. In FIG. 4, the pixels 308 have not yet been assigned to one of the three initial parent clusters. The process of assigning pixels to clusters and the result of that assignment are described below with respect to FIG. 6.

In some examples, a modified recursive mean calculation for centroids is used minimize compute load. For the modified recursive mean calculation, n=number of pixels assigned to a centroid, $n_{quant}$=n quantized to a power of 2 value (1, 2, 4, 8, 16, . . . , 1024), and $S_n=S_{n-1}+x_n$. If ($n_{quant}$==n), $\mu_n=S_n/n$ (perform divide with a simple binary shift since n is a power of 2). Otherwise, $\mu_n=\mu_{n-1}+(x_n-\mu_{n-1})/n_{quant}$ (divide is also just a simple binary shift).

In some examples, PCC compression determines the nearest cluster for each pixel. The nearest cluster may be based on a weighted absolute difference (WAD). In some examples, the WAD sum accounts for human sensitivity to given wavelengths. For example, PCC compression may include determining a nearest cluster for each pixel of the image based on a weighted absolute difference sum calculation that applies different weights to red, green, and blue absolute difference sums. In one example, if $R_{diff}$=abs($R_{centroid}$−$R_{pixel}$), $G_{diff}$=abs($G_{centroid}$−$G_{pixel}$), $B_{diff}$=abs($B_{centroid}$−$B_{pixel}$), then WAD=2*$R_{diff}$+4*$G_{diff}$+1*$B_{diff}$. In this example, abs($R_{centroid}$−$R_{pixel}$) is the red absolute difference sum, abs($G_{centroid}$−$G_{pixel}$) is a green absolute difference sum, abs($B_{centroid}$−$B_{pixel}$) is a blue absolute difference sum, 2 is a weight applied to the red absolute difference sum, 4 is a weight applied to the green absolute difference sum, and 1 is a weight applied to the blue absolute difference sum. In different examples, the weightings for red, green, and blue may vary. As pixels are added, PCC compression recursively adjusts the cluster centroid. PCC compression also traverse pixels in a spatially high frequency manner. In other examples, a nearest cluster may be based on a weighted squared difference. An example weighted squared difference calculation is: $W_R*R_{diff}^2+W_G*G_{diff}^2+W_G*B_{diff}^2$, where $W_R$ is the red weighting, $W_G$ is the green weighting, and $W_B$ is the blue weighting. In still other examples, a nearest cluster may be based on a maximum weighted difference. An example maximum weighted difference calculation is: max([($W_R$*$R_{diff}$), ($W_G$*$G_{diff}$), ($W_B$*$B_{diff}$).

Figure 5:
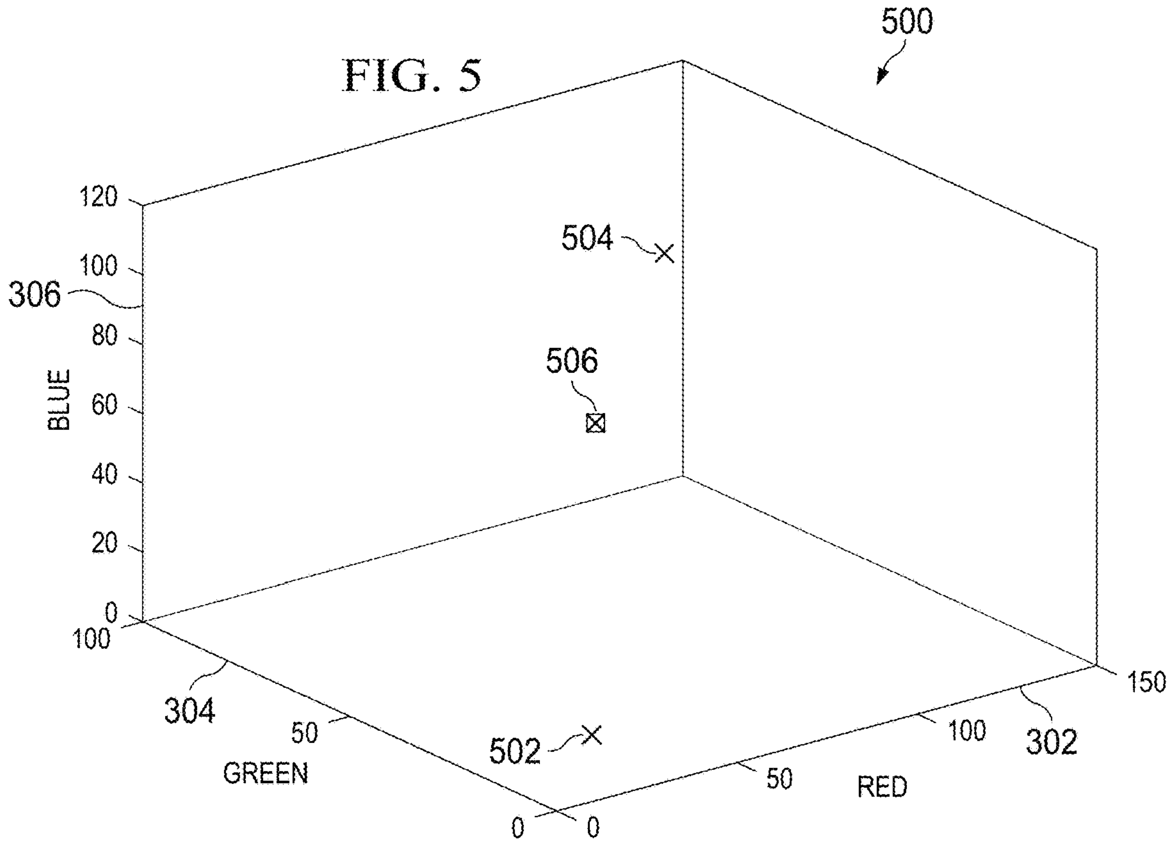
FIG. 5 is a graph of three isolated cluster centroids during PCC compression in accordance with various examples.

FIG. 5 is a graph 500 of three initial isolated cluster centroids during PCC compression in RGB space. As described below, these three pixel locations will serve as centroids for three different clusters of pixels, composed of the 256 pixels of pixels 308. Centroid 502 is placed at the location of location 402 from graph 400, which was the location of the dimmest pixel. Centroid 504 is placed at the location of location 404 from graph 400, which was the location of the brightest pixel. Centroid 506 is placed at location 406 from graph 400, which was the location of the mean of the data set of pixels. In the next step described below in FIG. 6, every pixel of the 256 pixels of pixels 308 is assigned to one of three clusters, where the three clusters are based on the three centroids (502, 504, 506).

Figure 6:
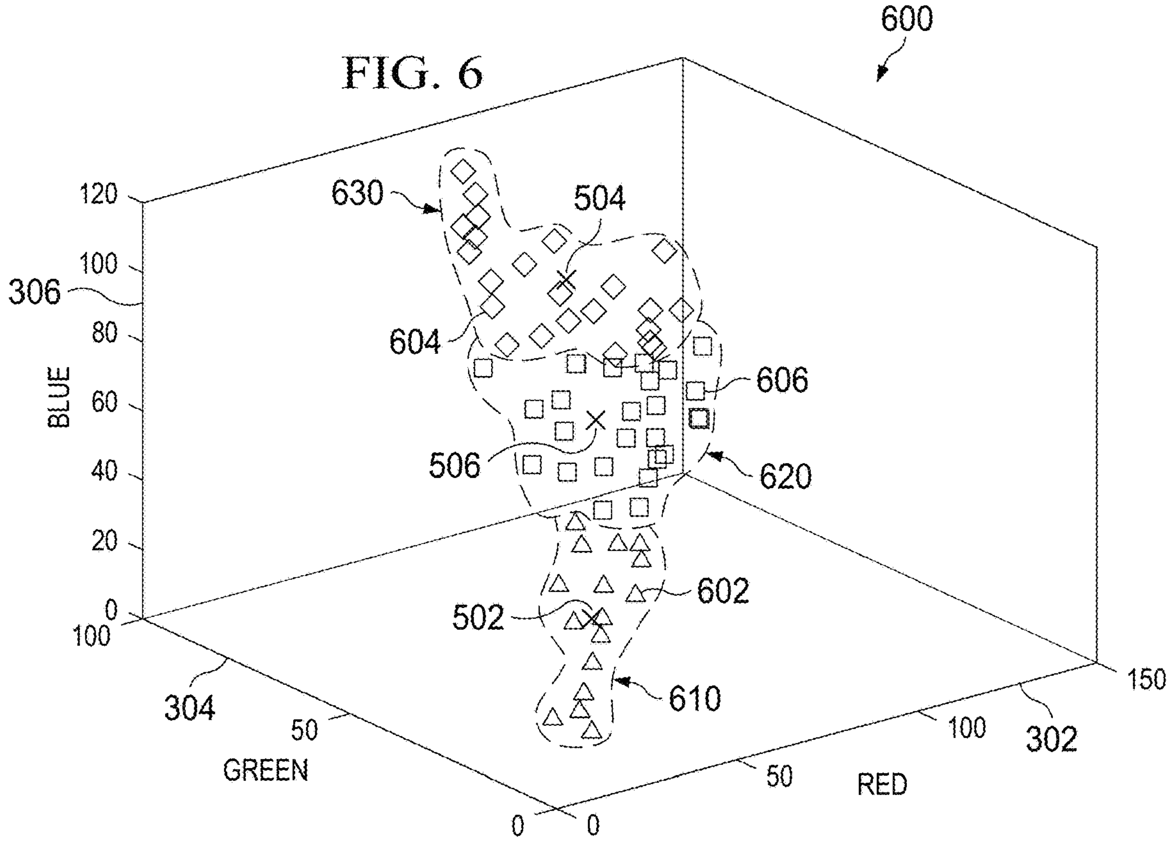
FIG. 6 is a graph of three clusters during PCC compression in accordance with various examples.

FIG. 6 is a graph 600 of three clusters during PCC compression in accordance with various examples. In graph 600, pixels 308 are assigned to one of the three clusters associated with centroids 502, 504, and 506. The procedure for assigning each of the pixels to a cluster is known as K-means clustering, and operates as follows. First, for each pixel of the 256 pixels in the sub-block 202, PCC compression may begin by determining a distance to the nearest cluster (represented by the location of the centroid for the respective cluster). In examples, any suitable type of distance function DIFF can be used. For example, distance can be calculated using summed absolute difference, mean squared error, weighted summed absolute difference, or any other suitable distance functions. One type of distance function is used for the examples herein, but any distance function is useful in other examples. In an example herein, the maximum absolute difference is used as a difference function DIFF. In this example, the nearest cluster is determined by finding the smallest maximum absolute difference between a given pixel and each of the centroids. The difference is represented as DIFF herein. For each of the pixels 308, the red component, the blue component, and the green component of the pixel in RGB space ($R_{pixel}$, $G_{pixel}$, $B_{pixel}$) are compared to the red, blue, and green components of each centroid in RGB space ($R_{centroid}$, $G_{centroid}$, $B_{centroid}$), respectively. The difference between a pixel of the pixels 308 and a given centroid is determined by the following equations (1) to (4).

$$R_{diff}=\mathrm{abs}(R_{centroid}-R_{pixel}) \quad (1)$$

$$G_{diff}=\mathrm{abs}(G_{centroid}-G_{pixel}) \quad (2)$$

$$B_{diff}=\mathrm{abs}(B_{centroid}-B_{pixel}) \quad (3)$$

$$\mathrm{DIFF}=\max(R_{diff},G_{diff},B_{diff}) \quad (4)$$

In the example of graph 600, there are three sample pixels 602, 604, and 606. In other examples, any pixel of the pixels 308 can be selected as the starting pixel. Pixel 602 has an RGB value that denotes its location in RGB space. Centroid 502 also has an RGB value that denotes its location in RGB space. The absolute value of the three differences in the red, green, and blue values between pixel 602 and centroid 502 are computed. For instance, using hypothetical numbers in one example, the difference in the red components is 20 ($R_{diff}$=20), the difference in the green components is 26 ($G_{diff}$=26), and the difference in the blue components is 18 ($B_{diff}$=18). These three difference values are used in the DIFF equation, where the maximum value of the set of (20, 26, 18) is selected. That maximum value is 26. That means the maximum absolute difference between pixel 602 and centroid 502 has a value of 26. That value of 26 is stored and will be used again later in the PCC compression process.

Next, the above calculations are performed twice more to determine the DIFF value for pixel 602 and centroid 506, and to determine the DIFF value for pixel 602 and centroid 504. As seen in graph 600, pixel 602 is farther away from centroids 506 and 504 than from centroid 502. Therefore, these two DIFF values are likely to be higher than 26, which is the DIFF value for pixel 602 and centroid 502. As a hypothetical example, the DIFF value for pixel 602 and centroid 506 is 42, and the DIFF value for pixel 602 and the centroid 504 is 55, as determined by the above equations. Three DIFF values have therefore been determined for pixel 602. The minimum of these three DIFF values (26, 42, 55) is 26, which is the DIFF value for pixel 602 and centroid 502. This means that pixel 602 is closest to centroid 502 of the three centroids, and pixel 602 is then assigned to the cluster that corresponds to centroid 502. The cluster that pixel 602 is assigned to is labeled cluster 610. At the beginning of the process, pixel 602 will be the only pixel assigned to cluster 610. As all 256 pixels in the sub-block 202 are processed, more pixels will be assigned to cluster 610, and also to the other clusters.

In this example, pixel 602 is the first pixel of the 256 pixels in the sub-block 202 that is assigned to a cluster. Before the second pixel is assigned to a cluster (e.g., pixel 604 or pixel 606), the cluster centroid that pixel 602 was assigned to is updated. That is, because pixel 602 has been assigned to cluster 610, the location of centroid 502, which is the centroid of cluster 610, is recalculated. The centroid of cluster 610 is the mathematical center, in RGB space, of all the pixels that have been assigned to cluster 610. As each new pixel is assigned to cluster 610, the location of centroid 502 is updated and will therefore move in RGB space to an updated location. The movement and final location of centroid 502 depends on how many pixels are assigned to cluster 610 and how spread out the pixels are in RGB space. In FIG. 6, the location of centroid 502 is the centroid of cluster 610 after all 256 pixels of the sub-block 202 have been assigned to one of the three clusters 610, 620, and 630. Lines are shown around clusters 610, 620, and 630 to denote which pixels belong to each cluster. Sometimes, clusters 610, 620, and 630 are described as parent clusters herein.

After the first pixel, pixel 602, has been assigned to cluster 610 and centroid 502 has been updated, a second pixel from the sub-block 202 is selected and assigned to a cluster using the process described above. For example, pixel 604 has been assigned to cluster 630, as it is determined to be closest to centroid 504 after using the above process. Then a third pixel is selected and processed. As another example, pixel 606 has been assigned to cluster 620, as it is found to be closest to centroid 506 after using the above process. Each of the remaining pixels in the sub-block 202 is then selected and processed using the above-described techniques and assigned to an appropriate cluster, with the centroids (502, 504, 506) of the clusters being updated after each pixel is assigned. The result of assigning the 256 pixels to clusters 610, 620, and 630 is shown in FIG. 6. Again, for simplicity, not all 256 pixels are shown in FIG. 6. Lines have been drawn around clusters 610, 620, and 630 in FIG. 6 to visually show which pixels belong to which group. The centroids 502, 504, and 506 are also shown in their final updated location.

As each pixel is assigned to a cluster 610, 620, or 630, a running DIFF value is tracked for each cluster. For example, pixel 602 had a minimum DIFF value of 26 as described above, which was used to assign pixel 602 to cluster 610. For each pixel assigned to cluster 610, the sum of the DIFF values for that cluster is computed. The DIFF value of 26 for pixel 602 is added to the DIFF values for all other pixels assigned to cluster 610 and a running total is tracked. Similar running total DIFF values are tracked for clusters 620 and 630. A lower sum of the DIFF values for a cluster indicates a tighter grouping of the pixels that make up that cluster. As a hypothetical example, the DIFF for each cluster are: cluster 610 has DIFF sum=1992; cluster 620 has DIFF sum=2814; and cluster 630 has a DIFF sum=3786.

The next step in PCC compression is to split the clusters into parent and child clusters. In one example herein, clusters are split according to the processes described below until eight clusters result. In other examples, clusters may be split until a different number of clusters is created. “Parent clusters” refers to the original clusters 610, 620, and 630. The second level of clusters that are created as a result of the parent cluster being split are called “child clusters”. In an example herein, a parent cluster produces two child clusters, but in other examples the parent cluster can produce any number of child clusters.

Figure 7:
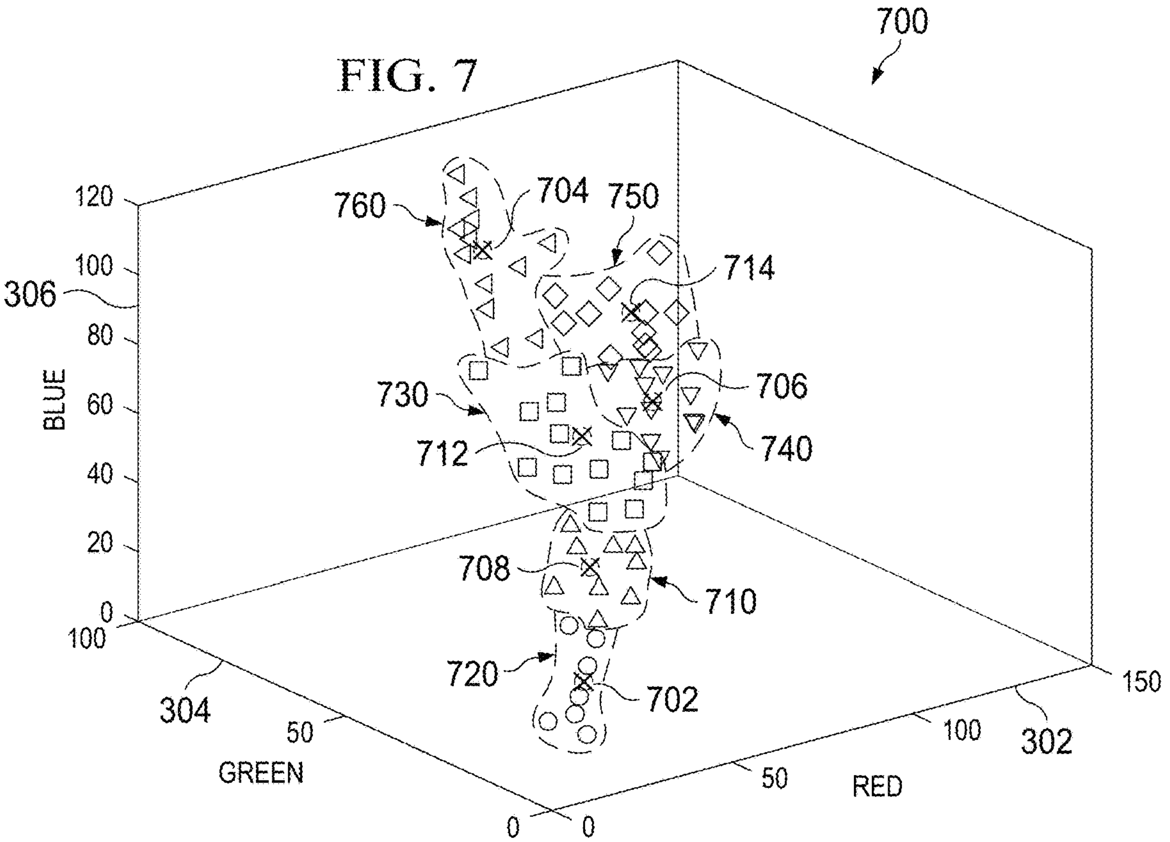
FIG. 7 is a graph of split clusters during PCC compression in accordance with various examples.

FIG. 7 is a graph 700 of split clusters during PCC compression in accordance with various examples. Graph 700 shows the child clusters after each parent cluster is split into two child clusters. These child clusters are then analyzed as described below to determine whether each respective child cluster will replace its parent cluster.

In graph 700, cluster 610 from FIG. 6 is subdivided into child clusters 710 and 720. Cluster 620 from FIG. 6 is subdivided into child clusters 730 and 740. Cluster 630 from FIG. 6 is subdivided into child clusters 750 and 760. To subdivide the parent clusters into these child clusters, the pixels are processed one at a time. The pixels can be chosen randomly or processed in any order. First, a pixel is chosen and then the parent cluster that the pixel is closest to is determined. Then, the next step is determining which child cluster of that parent cluster the pixel is closest to. If this is the first pixel chosen for a given parent cluster, then a first child cluster is initialized with a centroid at the location of the first pixel. For example, if a pixel at location 702 is the first pixel chosen, the pixel at location 702 is closest to centroid 502 of cluster 610, and a first child cluster 720 of cluster 610 is initialized with a centroid at location 702.

If a second pixel is chosen and its closest parent cluster is cluster 610, the second pixel is processed as follows. First, if the second pixel is in the same location as location 702, the second pixel is assigned to child cluster 720. If the second pixel is in a different location than location 702, a second child cluster is created that has a centroid at the location of the second pixel. For example, a pixel at location 708 is the second pixel chosen for processing. Location 708 is at a different location than location 702, so a second child cluster 710 is created with a centroid at location 708. As new pixels are processed that are closest to cluster 610, those new pixels are assigned to either the first child cluster 720 or the second child cluster 710. As those new pixels are assigned to the child clusters, the locations of the centroids of the child clusters are updated as described above. The final locations of the centroids for each of the clusters may not be at a location where a pixel is present. Instead, the centroid is the mathematical center of the pixels that have been assigned to a given cluster.

The other pixels are then processed similarly. The assignment of the pixels to a specific cluster is determined using Equations 1-4 above and the DIFF values, as described with respect to FIG. 6. After each pixel is assigned to a child cluster, the centroid of the cluster that the pixel was assigned to is updated.

The process of assigning pixels to clusters and dividing clusters as described above may continue for each pixel of a sub-block, such as the sub-block 202. The first time that a pixel is found to be closest to cluster 620 in FIG. 6, a first child cluster is created (e.g., child cluster 730). As the second pixel closest to cluster 620 is processed, that pixel is used to create a second child cluster (e.g., child cluster 740), as described above with respect to child clusters 710 and 720. Likewise, graph 700 shows that cluster 630 has been split into child clusters 750 and 760. In this example, each parent cluster has been split into two child clusters, but in other examples some parent clusters may not be split, or some parent clusters may be split into more than two child clusters.

In the example in FIG. 7, all 256 pixels have been assigned to one of the six child clusters (710, 720, 730, 740, 750, 760). For simplicity, not all 256 pixels are shown. The centroids of the child clusters have also all been updated as pixels are added to the child clusters, and the final location of these six child cluster centroids is shown in FIG. 7 (locations 702, 704, 706, 708, 712, 714). Also, a running DIFF total is kept for each child cluster, just as a running DIFF total was kept for each parent cluster in FIG. 6 above. These running DIFF totals of the child clusters are used to determine how the parent cluster will be split into child clusters. To recap, the hypothetical DIFF totals for the parent clusters above are: cluster 610 has a DIFF sum=1992; cluster 620 has a DIFF sum=2814; and cluster 630 has a DIFF sum=3786. For the child clusters, the hypothetical DIFF sums in this example are: child cluster 710 has a DIFF sum=545; child cluster 720 has a DIFF sum=525; child cluster 730 has a DIFF sum=673; child cluster 740 has a DIFF sum=775; child cluster 750 has a DIFF sum=1999; and child cluster 760 has a DIFF sum=787.

In some examples, the next step in the PCC compression process is to determine how much a DIFF score can be improved if a parent cluster is split into its respective child clusters. The DIFF score of the parent clusters is an indication of how dispersed the parent cluster is. A goal of PCC compression is to represent the pixels in a given cluster with a single value, in order to provide compression of the pixel data. Representing pixels with a single value that are close to one another provides a better compression result than representing pixels with a single value that are far apart. Therefore, the DIFF scores are used to break up the clusters that are spread out, in order to create smaller clusters that are more compact, which provides better compression results.

The improvement in DIFF scores that can be attained from breaking up a parent cluster is determined by the DIFF scores of the child clusters of that parent. If the child clusters can reduce the DIFF scores compared to the parent cluster, the results of the compression algorithm can be improved by breaking the parent cluster into its respective child clusters. This improvement is indicated by calculating a DIFF improvement score, which is the parent DIFF value minus the summation of its two (or more) child DIFF values. The DIFF improvement score is an indicator of how the overall compactness of the clusters is affected by splitting a cluster. A higher DIFF improvement score is used to determine which cluster to split to most improve the overall compactness of the clusters. This process of assigning pixels to child clusters and then determining if the child clusters should replace the parent clusters can be performed multiple times in some examples, until a target number of clusters is reached.

For example, cluster 630 has a DIFF value of 3786. Subtracting cluster 630's two child cluster DIFF values from 3786 provides a DIFF improvement score of 1000 (3786−1999−787=1000). Cluster 620 has a DIFF value of 2814. Subtracting cluster 620's two child cluster DIFF values from 2814 provides a DIFF improvement score of 1366 (2814−673−775=1366). Cluster 610 has a DIFF value of 1992. Subtracting cluster 610's two child cluster DIFF values from 1992 provides a DIFF improvement score of 922 (1992−525−545=922). The DIFF improvement scores are then sorted from largest to smallest (e.g., 1366, 1000, 922). The parent clusters are split according to the ordered list of DIFF improvement scores. In this example, splitting cluster 620 yields a DIFF improvement score of 1366, so cluster 620 is split into its two respective child clusters first (child clusters 730 and 740).

Clusters will continue to be split in this manner until one of two conditions is met. The first condition is that the number of clusters reaches a target number. In the example of FIG. 7, eight clusters are created, but another number of clusters may be useful in other examples. The second condition occurs responsive to the maximum DIFF sum among the child clusters being less than the next largest parent DIFF sum. What that means is that a parent cluster was split into two child clusters, and one of the two child clusters has a large DIFF value. If that value is larger than the parent cluster value of the next sorted value in the list, the child cluster should be split further before the next parent cluster is split. A large DIFF value means the child cluster is highly dispersed due to the pixels assigned to it. Therefore, that child cluster is split before the next parent cluster is split.

For example, cluster 620 is split into its two respective child clusters (730 and 740), as noted above. Cluster 620 had a DIFF value of 2814, and it is replaced with child clusters that have DIFF values of 673 and 775. The next cluster in the sorted list of parent DIFF improvement scores is cluster 630, which has a DIFF of 3786 and can be improved by 1000. Cluster 630 is split into child clusters 750 and 760, which have DIFF scores of 1999 and 787, respectively. At this point, two clusters from FIGS. 5 (620 and 630) have been split, and cluster 610 remains unsplit. For example, before the splitting algorithm was performed, the RGB coordinates of the three centroids are: cluster 610 has centroid 502 at (43,29,27); cluster 620 has centroid 506 at (88,62,55); and cluster 630 has centroid 504 at (99,84,79). After clusters 620 and 630 have been split, there are five clusters. Cluster 610 has not been split, so it remains, along with the four new child clusters: cluster with centroid 502 at (43,29,27); child cluster 730 with centroid at location 712 (i.e., 76,59,55); child cluster 740 with centroid at location 706 (i.e., at 103,65,54); child cluster 750 with centroid at location 714 (i.e., at 113,79,68); and child cluster 760 with centroid at location 704 (i.e., at 84,89,90).

Because there are five clusters at this point, additional splitting iterations will continue until eight clusters is reached. The additional splitting iterations involve repeating the process of assigning pixels to parent cluster and child clusters, and then determining DIFF improvement scores to decide if a cluster should be split, as described above. Some splitting iterations may produce more child clusters than other iterations. In this example, the next cluster in the sorted list of parent DIFF improvement scores is cluster 610, which has a DIFF score of 1992 and a cluster improvement score of 922. However, at this point the second condition described above is met. The DIFF score of 1992 for cluster 610 is less than the DIFF score for one of the child clusters, child cluster 750, which has a DIFF score of 1999. This indicates that the child cluster 750 should be split before the cluster 610 is split.

The splitting process continues as described above until eight clusters are created. For example, child cluster 750 may be split, and the pixels of child cluster 750 may be assigned to the child clusters of the child cluster 750 using the process described above. Pixels are also assigned to the other existing clusters as described above. The process of splitting clusters, assigning pixels to the clusters, and computing DIFF values continues as set forth above until eight clusters are created. The details of the process to go from five clusters to eight clusters is omitted for simplicity.

Figure 8:
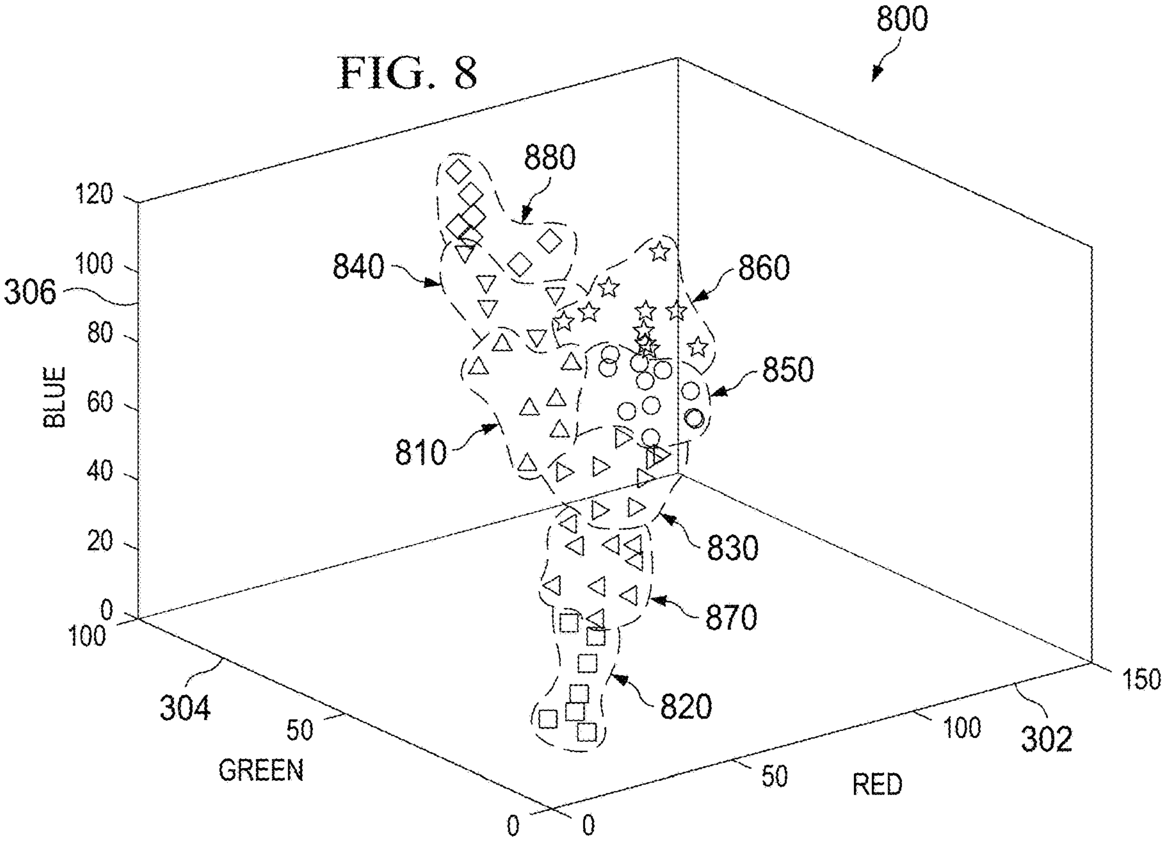
FIG. 8 is a graph of eight split clusters during PCC compression in accordance with various examples.
Figure 9:
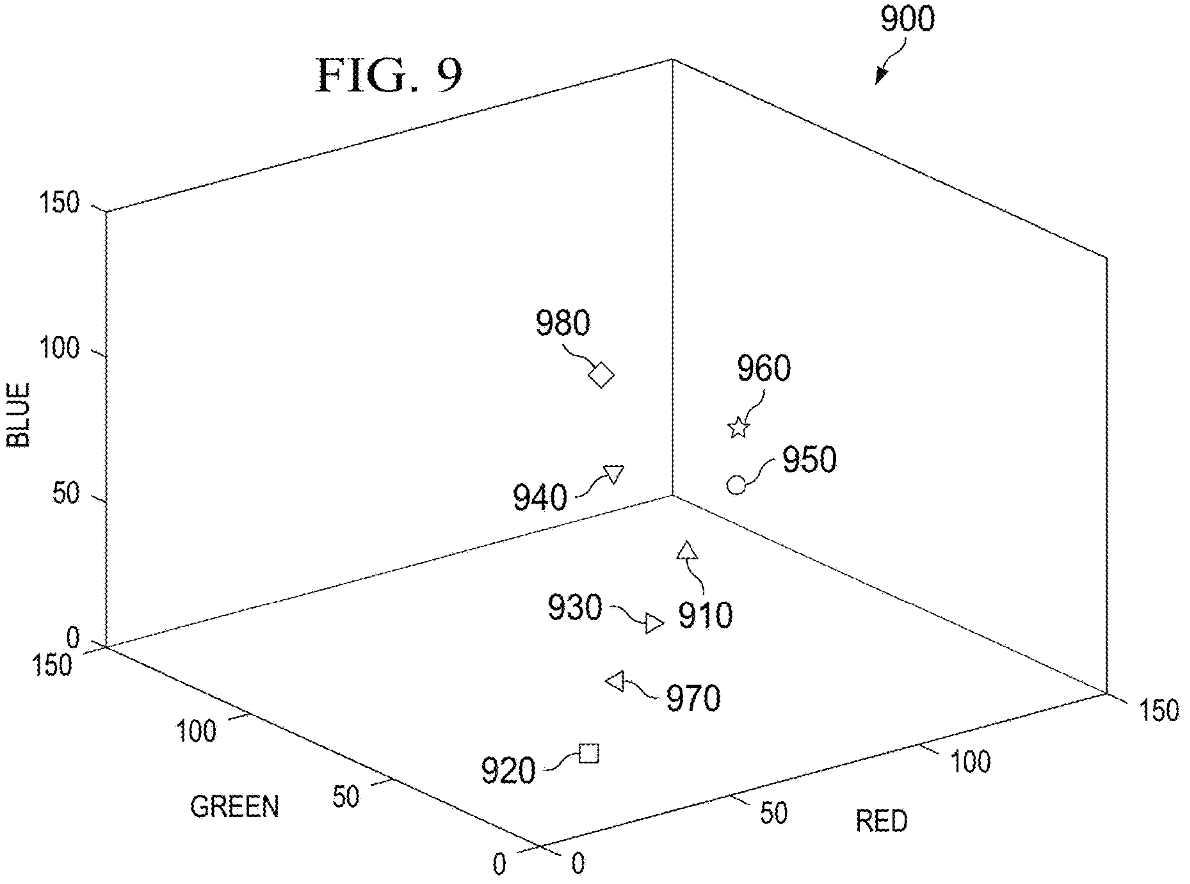
FIG. 9 is a graph of the centroids of the eight clusters from the graph of FIG. 8.

FIG. 8 is a graph 800 of eight split clusters during PCC compression in accordance with various examples. Each of the 256 pixels of the sub-block 202 has been assigned to one of the eight clusters using the technique described above with respect to FIGS. 5-7. For simplicity, not all 256 pixels are shown in graph 800. Lines are shown around the eight split clusters to mark which pixels belong to which cluster. These eight clusters are labeled as clusters 810, 820, 830, 840, 850, 860, 870, and 880. Each cluster has a centroid that is the centroid of all the pixels that are assigned to that cluster. The centroids are not shown in FIG. 8, but are shown in FIG. 9. The pixel values for each of the 256 pixels will be replaced with the centroid of the cluster that each respective pixel has been assigned to. For example, each pixel from the sub-block 202 in cluster 810 will be replaced with the RGB value for the centroid of cluster 810. Likewise, each pixel in cluster 820 will be replaced with the centroid of cluster 820, and so on for each of the eight clusters. The PCC compression algorithm has therefore replaced 256 different pixel values (also called palette keys herein) from the pixels in the sub-block 202 with just 8 pixel values, with the 8 pixel values determined by the centroids of the clusters. Because the clusters were created by grouping pixels that are close to one another in RGB space, the 8 pixel values that replace the original 256 pixel values will compress the data while also providing an RGB value for each pixel that is close to the original RGB value of the pixel. This RGB value replacement is one of the features of the PCC algorithm that provides improved compression results for a compressed image. After replacing each pixel in the sub-block 202 with one of the eight pixel values, a compressed image that includes the sub-block 202 can be displayed on a display using one of the eight pixel values for each pixel. In other examples, additional steps are taken as described below before displaying the compressed image on a display.

In some examples, for every cluster, the squared summation of assigned RGB values is tracked and used in cluster variance derivation. In some examples, the cluster variance is calculated as: a $\sigma^2=\Sigma(x_n^2)/n-(\Sigma x_n/n)^2=\Sigma(x_n^2)/n-\mu^2$, where n is the number of pixels assigned to a cluster, $x_n$ are the pixels of the cluster, and $\mu$ is the 3-D mean of the pixel when assigned. By using a variance equation, such as the a $\sigma^2$ equation above, the $\mu$ for each pixel is updated each time a new pixel is added to a cluster. In other words, the centroid and $\mu$ relative to the centroid is adjusted in responsive to a new pixel being added to a cluster. At the end of an iterative loop, after all pixels have been assigned to a cluster, a weighted variance, WV, is derived for each cluster. In some examples, PCC compression includes: applying a weighted cluster variance calculation that applies different weights to red, green, and blue variances; and reducing the initial pixel colors to the palette keys responsive to the parent-child cluster compression. In some examples, WV is calculated as: $WV=2*\sigma_{red}^2+4*\sigma_{green}^2+1*\sigma_{blue}^2$, where bred is the standard deviation of red in a cluster, $\sigma_{red}^2$ is the variance of red in the cluster, $\sigma_{green}$ is the standard deviation of green in the cluster, $\sigma_{green}^2$ is the variance of green in the cluster, $\sigma_{blue}$ is the standard deviation of blue in the cluster, $\sigma_{blue}^2$ is the variance of blue in the cluster, 2 is the weight applied to the red variance, 4 is the weight applied to the green variance, and 1 is the weight applied to the blue variance.

In some examples, if the palette list is less than 8 (the maximum length): a WV improvement score is calculated which is the parent WV minus the average of its child clusters' WVs; the improvement scores are sorted from largest to smallest; the palette is split based on the largest improvement score; and the parent cluster is replaced with the 2 child clusters in the palette list. In some examples, repetition of the above steps are performed if the number of palette entries is still less than 8 and: 1) the maximum WV among all the child clusters added to the list is less than the next largest parent WV sum; or 2) this is the 2nd-to-last pass/iteration of the clustering algorithm (4 iterations expected).

FIG. 9 is a graph 900 of the centroids of the eight clusters from graph 800. The eight cluster centroids are also referred to as palettes. Each of the 256 pixels in the sub-block 202 is represented by one of these eight palettes. The eight palettes are palettes 910, 920, 930, 940 950, 960, 970, and 980. Another aspect of PCC compression is that the technique can provide better low entropy performance in some examples. If an image such as the image in sub-block 202 is compressed to only eight palettes, the image becomes more quantized. That is, some of the subtle gradations from pixel to pixel are removed from the image due to the compression. The areas where subtle gradations occur are referred to as low entropy areas. If the image has a shallow gradient (such as a shadow that should appear smooth, without a harsh boundary), PCC compression can provide higher compressed image quality in those areas. Higher image quality is achieved by noting how often transitions occur between one palette value and another palette value in those area. To track these transitions, a spatial histogram is used.

Figure 10:
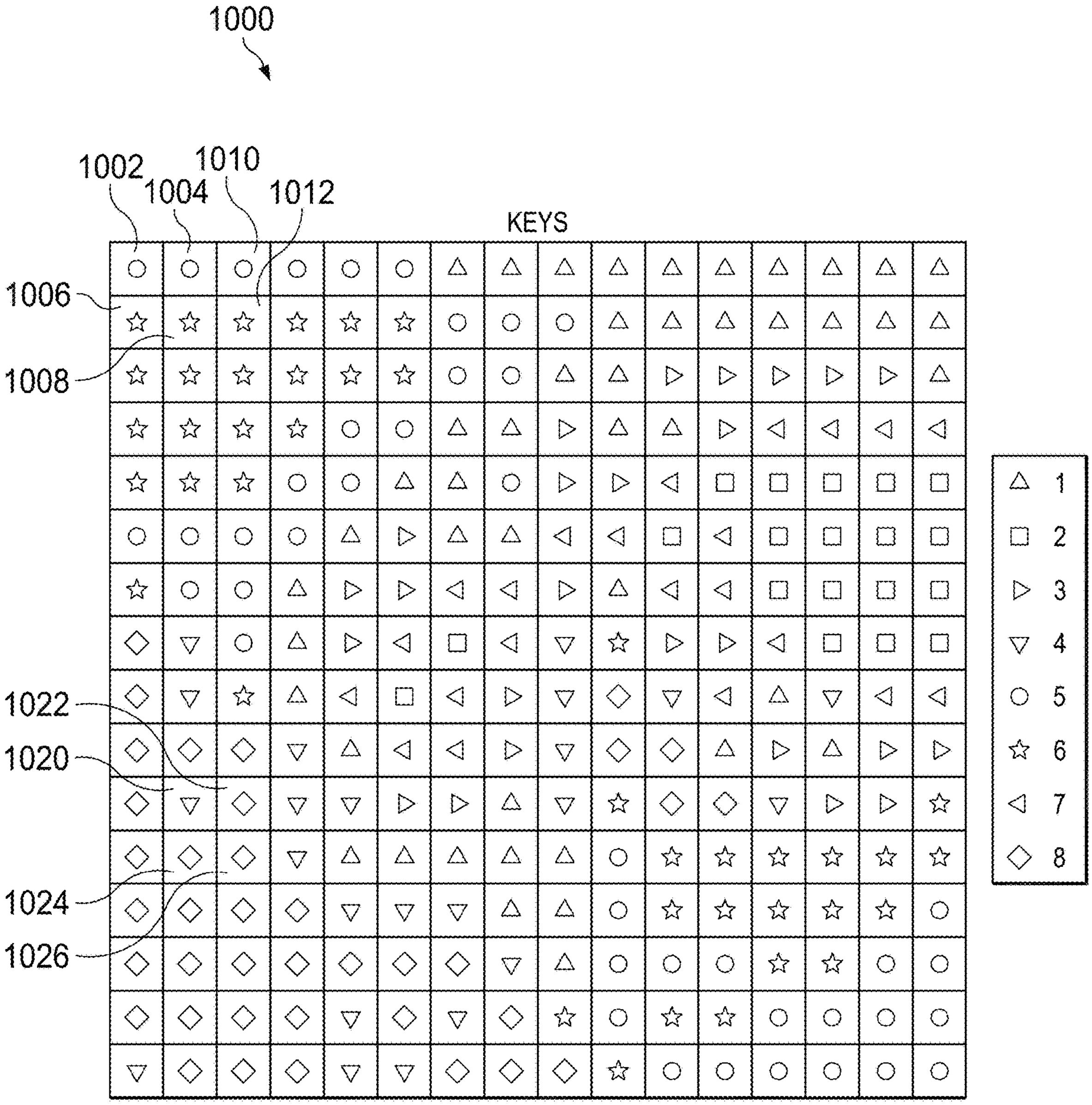
FIG. 10 is a diagram of palette keys for a portion of an image resulting from PCC compression in accordance with various examples.

FIG. 10 is a diagram 1000 of palette keys for a portion of an image resulting from PCC compression in accordance with various examples. In the diagram 1000, a 16×16 portion of an image (e.g., sub-block 202) is shown. In diagram 1000, each pixel of the portion has been replaced with a key that indicates which palette the pixel belongs to. For example, pixels in cluster 810 in FIG. 8 are replaced by palette 910 from FIG. 9, and those pixels are labeled with the key "1" in FIG. 9. Likewise, pixels in cluster 820 in FIG. 8 are replaced by palette 920 from FIG. 9, and those pixels are labeled with the key "2" in FIG. 9. The clusters 830 to 880 are replaced by palettes 930 to 980, respectively, and those pixels are labeled with keys "3" through "8" in FIG. 9, respectively. Therefore, each pixel from the clusters in FIG. 8 and its corresponding palette in FIG. 9 is denoted with a number 1 through 8 in diagram 1000 in FIG. 10. The numbers are arbitrary, and any number or letter or other designation could be used to denote the eight palette keys.

As seen in FIG. 9, the key numbers in the pixels that represent the corresponding palettes are often clustered around similar key numbers. That is, the top left of diagram 1000 has a large number of pixels assigned to palettes 5 and 6. The bottom left of diagram 1000 has a large number of pixels assigned to palette 8. The top right of diagram 1000 has a large number of pixels assigned to palette 3. Diagram 1000 shows how the pixels assigned to the different palettes are grouped spatially.

With diagram 1000, a count of the transitions between pixels from one key to another key can be conducted. A transition from one pixel to another means that the pixels are touching one another along an edge or at a corner. For example, for the pixels assigned to key 5, many transitions occur to either another pixel with key 5, or to pixels with keys 3 and 6. Conversely, diagram 1000 shows that there are not a lot of transitions between pixels with keys 5 and 2. In some examples, a histogram is created that shows the frequency of occurrence of a given transition from one key to another key. That transition information is then used to determine how to smooth out the clustering from one cluster to another.

For example, a process is performed that counts every transition from one pixel to another in the block of 256 pixels shown in diagram 1000. For example, the process begins at the top left corner of diagram 1000 with pixel 1002. Pixel 1002 has a palette key of 5, and touches three other pixels (1004, 1006, and 1008). Pixel 1002 has two transitions to one pixel with a palette key of 5 (pixel 1004) and 2 transitions to pixels with a palette key of 6 (pixels 1006 and 1008). The transitions to pixels with the same palette key do not have to be counted in this process. Therefore, the transitions from palette key 5 to palette key 5 can be ignored, and the transition from palette key 5 to palette key 6 is incremented by 1.

Next, pixel 1004 is analyzed. Pixel 1004 has one transition to palette key 5 (pixel 1010), and two transitions to palette key 6 (pixels 1008 and 1012). The transition to key 5 is ignored, and the transitions from palette key 5 to palette key 6 are incremented by 2 (for a total of 3 transitions between palette keys 5 and 6). In this example, this process continues in order from left to right along the top row of pixels, and the moves to the second row of pixels, and proceeds from left to right along that row. The process continues along each row, from top to bottom, moving through the rows one pixel at a time from left to right.

As another example of the continuing process, pixel 1020 is analyzed. Pixel 1020 has been assigned the palette key of 4. Pixel 1020 has three transitions to palette key 8 (pixels 1022, 1024, and 1026). The transition count from palette key 4 to palette key 8 is incremented by 3. Note that the transitions from pixel 1020 to the pixels in the row above pixel 1020 are not counted, because these two transitions would have already been counted as the process counted the transitions for the two pixels above pixel 1020. The process should not double count any of the transitions between pixels with different keys.

The process for counting transitions can proceed in any order. As one example, the process starts with pixel 1002 and then counts the transitions for every pixel in the first row. Then, the process moves to the second row and counts the transitions for every pixel in the second row. The process proceeds systematically in this manner until all transitions have been counted. As noted above, if a transition between two pixels has been counted, it is not counted again as the process moves pixel by pixel through the diagram.

In some examples, a histogram of palette key transitions is recorded. The palette key transition analysis may be used to determine how to smooth out the clustering from one cluster to another. At this point, a list of eight palette key entries have been created (see FIG. 9), but the palette key entries are arbitrarily chosen without an order. With the next step in the PCC compression technique, an ordering is created based on RGB distance between key palettes, or based on the frequency of occurrence of one palette being spatially close to another palette based on recorded palette key transitions. To determine the order of palettes, a sorting algorithm is applied to the palettes. In examples herein, any suitable sorting algorithm is useful, including a sorting algorithm that uses RGB distance and palette key transition analysis. In one example sorting example described herein, the sorting algorithm first looks for a strong RGB bond between palettes. If no strong RGB bond is found, the sorting algorithm looks for a strong spatial bond as indicated by the numbers in the key transition analysis. The sorted list begins with the dimmest palette entry and then proceeds from there to complete the sorted list.

In some examples, the brightness of each palette is calculated and stored. Brightness, or luminance, can be determined using any suitable manner. One example for determining brightness of a palette is shown in equation (5).

$$\text{Brightness}=5*R+9*G+2*B, \tag{5}$$

where R, G, and B are the RGB values of the location of the palette as shown in FIG. 9. The results of these brightness calculations are omitted here for simplicity, but in an example the dimmest palette is palette 920 (key 2). Second, the distance between each palette is calculated and stored in an array. The distance between palettes can be calculated using the DIFF equation above, (equation (4)). If the distance between the palettes is smaller, the bond between the palettes is stronger. As seen in FIG. 8, some palettes are closer to one another than others. For example, palette 920 is close to palette 970, but palette 920 is far away from palette 980. The distance calculations between each palette are omitted here for simplicity. Based on the distance, the bond between palettes can be categorized as strong or not strong. For example, in an RGB space between 0 and 255, a distance of 16 or less indicates a strong bond between palettes. Other criteria for determining a strong bond is useful in other examples. The number of strong bonds that each palette has is calculated and stored. The ordering algorithm begins by using the key associated with the dimmest palette. As noted above, key 2 is the dimmest palette in this example. Fourth, the next closest palette to the starting palette (key 2) is determined. If the DIFF value of the next closest palette is less than a configurable threshold, that next closest palette is used as the next sorted entry. One example of a configurable threshold DIFF value may be 32. If the DIFF value of the next closest palette is more than the configurable threshold, the ordering moves to the next remaining key with the largest spatial connection to the starting key, based on the values in the key transition analysis.

Figure 11:
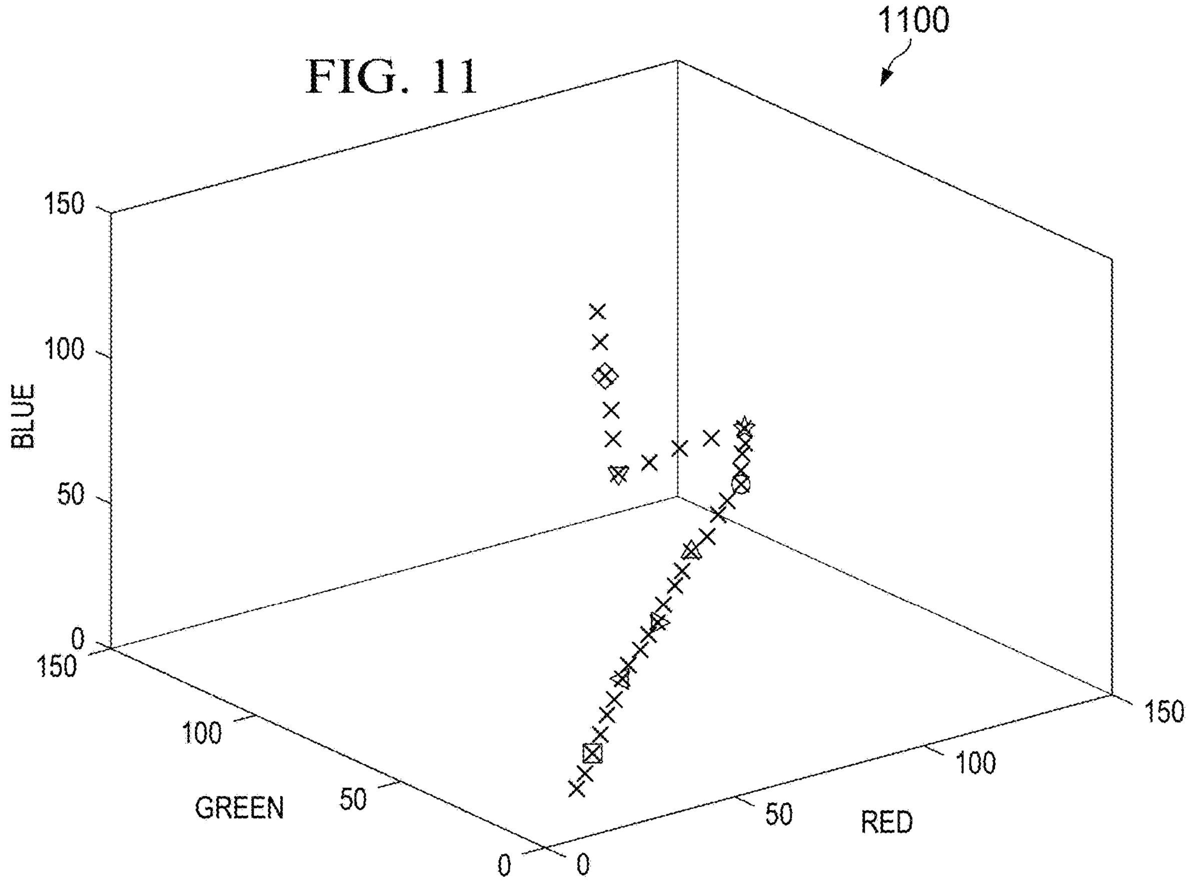
FIG. 11 is a graph of keys in RGB space in accordance with various examples.

FIG. 11 is a graph 1100 of keys in RGB space in accordance with various examples. In graph 1100, lines having been drawn between the keys to connect keys 1 to 8 in the order of the sorted list determined as describe above. The line begins at key 2, and moves to key 7, then key 3, key 1, key 5, key 6, key 4, and key 8. As the data is decompressed, 32 palettes will be used rather than eight. These eight additional palettes are shown as "x" labels in graph 1100. To create 32 palettes from the original eight palettes, bilinear interpolation is performed on the sorted palette list. The original eight keys were sorted as described above so bilinear interpolation could be performed. By sorting the original eight keys, an intermediate palette can be created between each key in the sorted list. With eight palettes, an image that is decompressed can exhibit some quantization if a pixel assigned to one palette is next to a pixel assigned to a different palette. By using 32 palettes rather than 8, the transitions from one pixel to the next can be made smoother and reduce quantization.

The areas where subtle gradation occur in an image are referred to as low entropy areas. Creating four times as many palettes allows for more subtle gradations in the image. In graph 1100, there are 24 "x" labels, whose locations are based on interpolating between keys 1 through 8 in the sorted list. Three new palettes are placed between each of keys 1 through 8 in the sorted list. However, there are only 7 spaces between keys 1 through 8. Therefore, additional palettes may be added by beyond key 2 and beyond key 8 as shown.

In some examples, new keys are placed in RGB space using bilinear interpolation between existing keys. The next step is to assign pixels to the new keys. Each original pixel in the sub-block 202 is analyzed to determine which of the 32 keys that pixel should be assigned to. For each pixel, the closest palette of the 24 new interpolated palettes is found. The closest palette can be found using the DIFF equations as described above (e.g., equations (1) to (4)). Any other suitable method for determining distance is useful in other examples. After the closest of the 24 new interpolated palettes is found, that distance is compared to the distance between the pixel and the palette it is currently assigned to. If the distance to the interpolated palette is less, the pixel is reassigned to the interpolated palette. If the distance to the interpolated palette is greater than the distance to the currently assigned palette, the pixel remains assigned to its current palette. Each pixel is analyzed in this manner and is either assigned to a new interpolated palette or remains assigned to the original palette the pixel was assigned to.

In one example, mean square error calculations for an image compressed and decompressed are used to determine the reduction in error that can be attained by using 32 palettes rather than eight palettes. One issue created by increasing the number of palettes from eight to 32 is that for every pixel that has been compressed or reduced to a single palette, a key indicates which palette that pixel is assigned to. With eight palettes, that key has one of eight values (0 to 7), and the key is encoded with three bits. If the list of palettes is increased to 32 palettes, the keys have to increase from 3 bits to 5 bits (to encode the values 0 through 31). Therefore, the keys should be compressed as well, or else the storage used for the compressed data set would increase to store the larger keys. In some examples, key compression reduces the amount of storage used with little visible impact on the end result of the PCC compression technique.

Figure 12A:
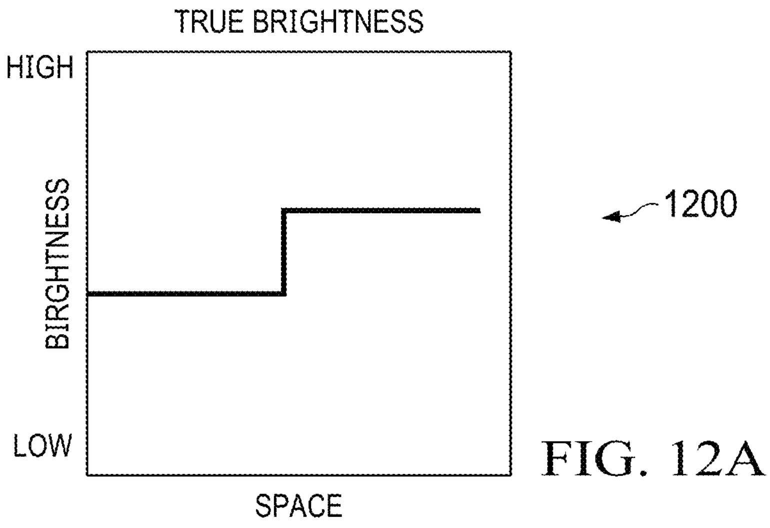
FIG. 12A is a graph of true brightness as a function of space in accordance with various examples.
Figure 12B:
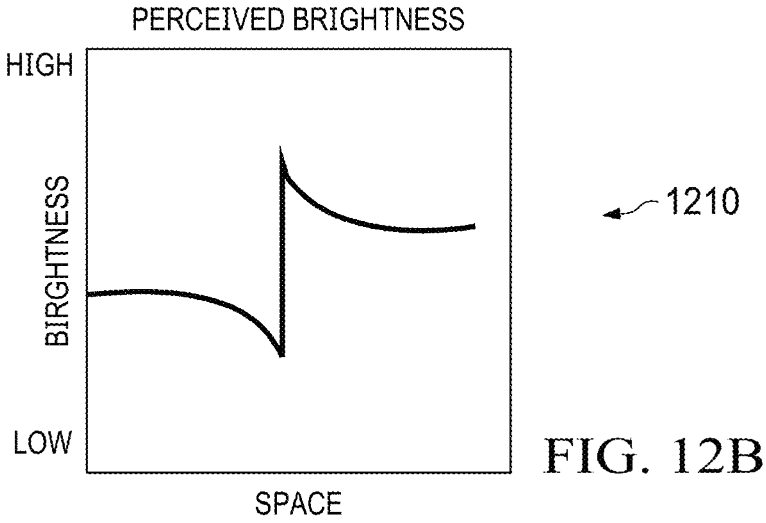
FIG. 12B is a graph of perceived brightness as a function of space in accordance with various examples.

FIG. 12A is a graph 1200 of true brightness as a function of space in accordance with various examples. FIG. 12B is a graph 1210 of perceived brightness as a function of space in accordance with various examples. Comparing graphs 1200 and 1210, the contrast of edges is exaggerated by the human visual system (HVS), an effect called the Mach Band Effect. Around edges/areas of high entropy, high spatial fidelity is needed but not high precision. Around shallow gradients/areas of low entropy, high precision is needed, but not high spatial fidelity. In some examples, compression of keys takes advantage of the Mach Band Effect. In other words, compression may help create overshoot and undershoot of brightness as a function of space so edges can be better perceived. This means that compression errors can be hidden along edges in an image. If a large percentage of the compression occurs at edges, it is not as perceivable as compression that occurs elsewhere in the image. In other words, the precision that is lost in high entropy areas is masked by the human visual system because of the Mach Band Effect.

In some examples, the amount of data used for storage is three bits per pixel. For each sub-block, a bit is used that indicates whether a high bit encoding or a low bit encoding produces the least error. On the encode side (the compression side), the minimum is calculated, along with the delta and the corresponding key value. Also, the error (if any) is calculated for each key value. For high entropy encoding, the closest palette in the original eight palette list is used and then the error associated with that palette list is determined. Whichever encoding produces the smallest error is used, and a 1-bit control value is set.

Storage requirements can vary based on the type of PCC compression implemented. In some examples, a light compression mode may use a block size for the PCC compression algorithm of 8×8. For the palettes, the storage requirement is eight palettes per color, times ten bits per color, times 3 colors per palette, which equals 240 bits. A 3-bit control is added for 243 bits. For the keys, 3 bits per pixel are used, with 64 pixels per block (192 bits). Sixteen 2×2 sub-blocks are used, with 1 control bit per sub-block (16 bits). Therefore 208 bits are used for keys. The bits per pixel are (243+208)/64 pixels, or 7.046875 bits per pixel.

In some examples, a heavy compression mode may use a block side for the PCC algorithm of 16×16. The palettes again use 243 bits. For the keys, the sub-block increases from 2×2 to 4×4. With that increase, 3 bits per pixel times 256 pixels per block is 768 bits. Added to that is 16 4×4 sub-blocks with 1 control bit per sub-block, for a total of 784 bits. The bits per pixel are (243+784)/256 pixels, or 4.0117 bits per pixel.

In one example, the maximum total storage for heavy compression used to store an Ultra High Definition (UHD) 4K image is (3840×2160 pixels per frame)*(4.0117 bits/pixel)*(1.0625 frames for a rolling buffer)=35.35 Mbits.

In one example, light compression mode produced a resulting peak signal to noise ratio (PSNR) between an original image and a compressed image of 41.9556 dB (decibels), using approximately 7 bits per pixel. A higher PSNR means a better quality for the compressed image. In another example, a heavy compression mode produced a PSNR of 38.4067 dB between the same original image and the compressed image, using approximately 4 bits per pixel. A PSNR in the high 30s to low 40s generally provides high quality results.

In some examples, recursive compression accounts for the Mach Band Effect by performing key compression based on gradient analysis and entropy analysis. The results of gradient analysis and entropy analysis are used to sub-sample keys for low entropy areas along local gradients. In some examples, each sub-block of 4×4 pixels is analyzed to determine the dominant gradient direction. In other examples, the sub-block size may vary. In some examples, 5-bit key (i.e., 32 colors) assignments are analyzed. In other examples, the number of bits for the keys and the related color options. Regardless of the sub-block size and key size, gradient analysis may include: sub-sample keys along each gradient (see e.g., FIG. 13); interpolate back up to obtain interpolated keys based on the sub-samples; calculate the summed absolute difference (SAD) of interpolated keys from the original 5-bit key assignments; determine the maximum absolute difference (MAD) for each direction; and use the gradient direction that produces the minimum SAD. If more than one gradient produces the same minimum SAD, the gradient with the minimum MAD is used. The selected gradient is sometimes referred to as the dominant gradient.

In some examples, entropy analysis involves: determining low-entropy and high-entropy areas along the gradient used; and using the encoding that produces the least error. In some examples, 1-bit control is used per 4×4 sub-block for low/high entropy control. For high-entropy areas along the dominant gradient, the original 8-entry palette list is used. For a 4×4 sub-block size, high-entropy encoding includes (3-bits/key)*(16 keys/sub-block)=48 bits/sub-block. For low-entropy areas along the dominant gradient, a 32-entry palette list is used. For a 4×4 sub-block size, low-entropy encoding includes (5-bits/key)(9 keys/sub-block)+(3-bit direction)=48 bits/sub-block.

Figure 13:
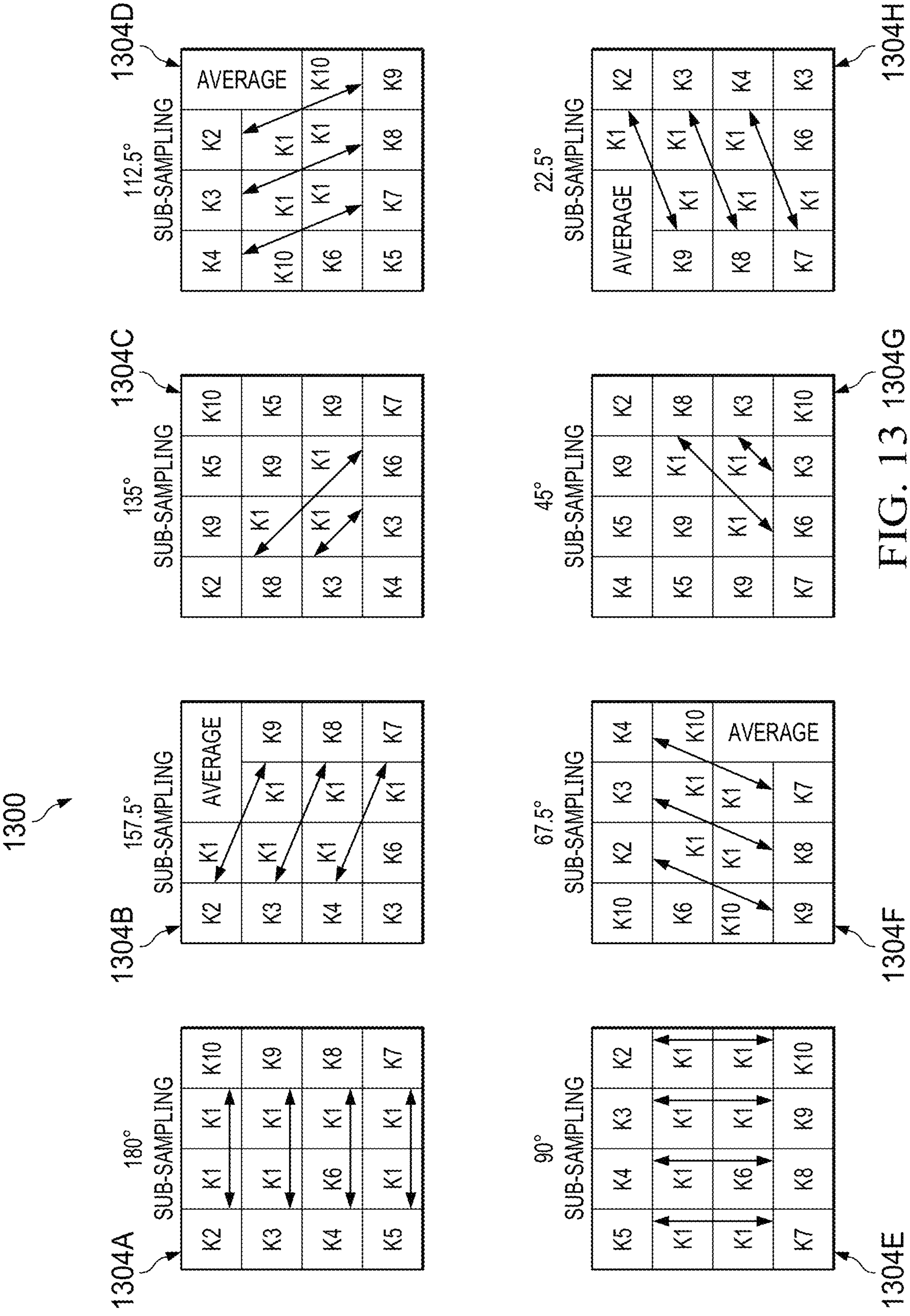
FIGS. 13 and 14 are diagrams of gradient analysis in accordance with various exam pies.
Figure 14:
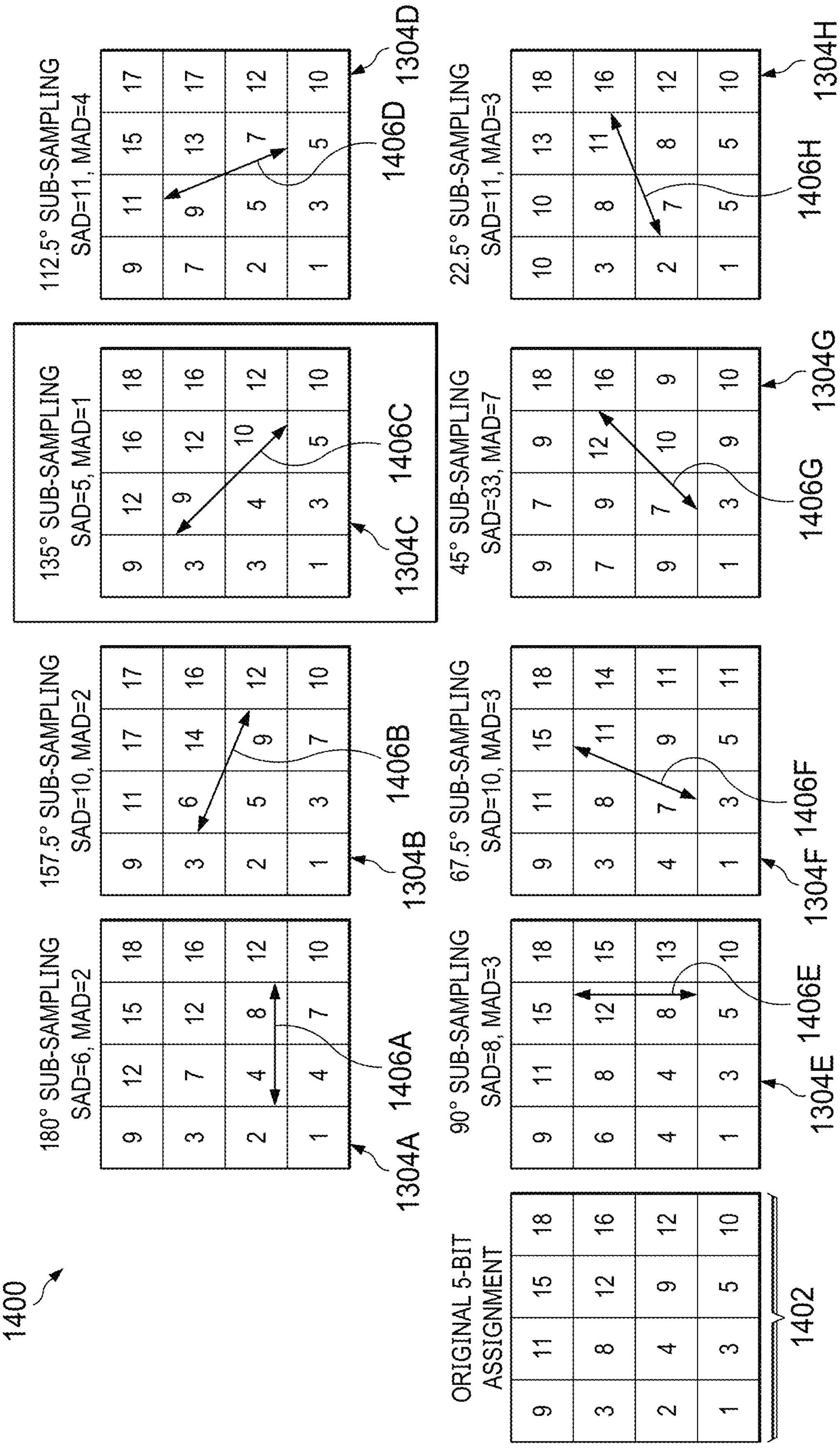

FIGS. 13 and 14 are diagrams 1300 and 1400 of gradient analysis in accordance with various examples. In the diagram 1300 of FIG. 13, sub-sampling of keys along different gradients of a sub-block is represented using sub-block examples 1304A to 1304H. In the diagram 1400 of FIG. 14, the original 5-bit assignment 1402 for a sub-block example is shown. Also, gradients 1406A to 1406H, SAD values, and MAD values are represented for each of the sub-block examples 1304A to 1304H. Based on the gradient analysis of diagrams 1300 and 1400, the sub-block example 1304C and its related gradient 1406C has the smallest SAD value and the smallest MAD value. In other words, the gradient analysis of diagrams 1300 and 1400 indicates that the gradient 1406C minimizes an error metric (e.g., the SAD value and/or the MAD value). Therefore, the gradient 1406C is used for entropy analysis and compression.

For low-entropy, the original 8 keys are interpolated to 32 keys, resulting in storage of sixteen 5-bit keys (80 bits total) being stored for each sub-block. For high-entropy, the original 8 keys are used directly, resulting in sixteen 3-bits keys (48 bits total) being stored for each sub-block. Gradient encoding reduces the keys from sixteen to nine (e.g., K2-K10), where seven keys (e.g., K1) are re-created during decompression. With gradient encoding, nine 5-bit keys plus a 3-bit gradient direction (48 bits total) are stored for each sub-block. In the diagram 1300, each position marked as K1 will decode to a unique value defined by its "endpoints" and the gradient direction.

Figure 15:
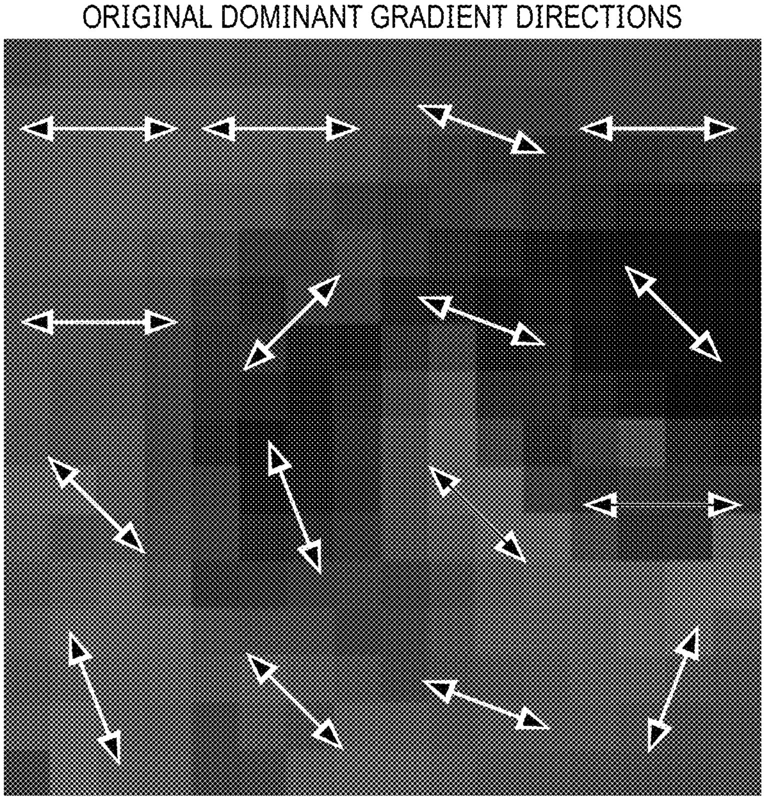
FIG. 15 is a portion of an image and related dominant gradient directions in accordance with various examples.

FIG. 15 is a portion 1500 of an image (e.g., the sub-block 202 in FIG. 2) and related dominant gradient directions in accordance with various examples. In FIG. 2, the portion 1500 is a 16×16 portion of an image, and the dominant gradient direction for each 4×4 sub-block of the portion 1500 is shown using respective arrows. In different examples, the size of the portion 1500 and/or the size of each sub-block used for gradient analysis may vary.

FIG. 16A is a diagram 1600 of palette key values before gradient-based compression for the portion 1500 of the image in FIG. 15 in accordance with various examples. In the diagram 1600, there are up to 32 colors in use, each color labeled 1 to 32.

FIG. 16B is a diagram 1610 of palette key values after gradient-based compression for the portion 1500 of the image in FIG. 15 in accordance with various examples. In the diagram 1610, there are again up to 32 colors in use, each color labeled 1 to 32.

Figure 17:
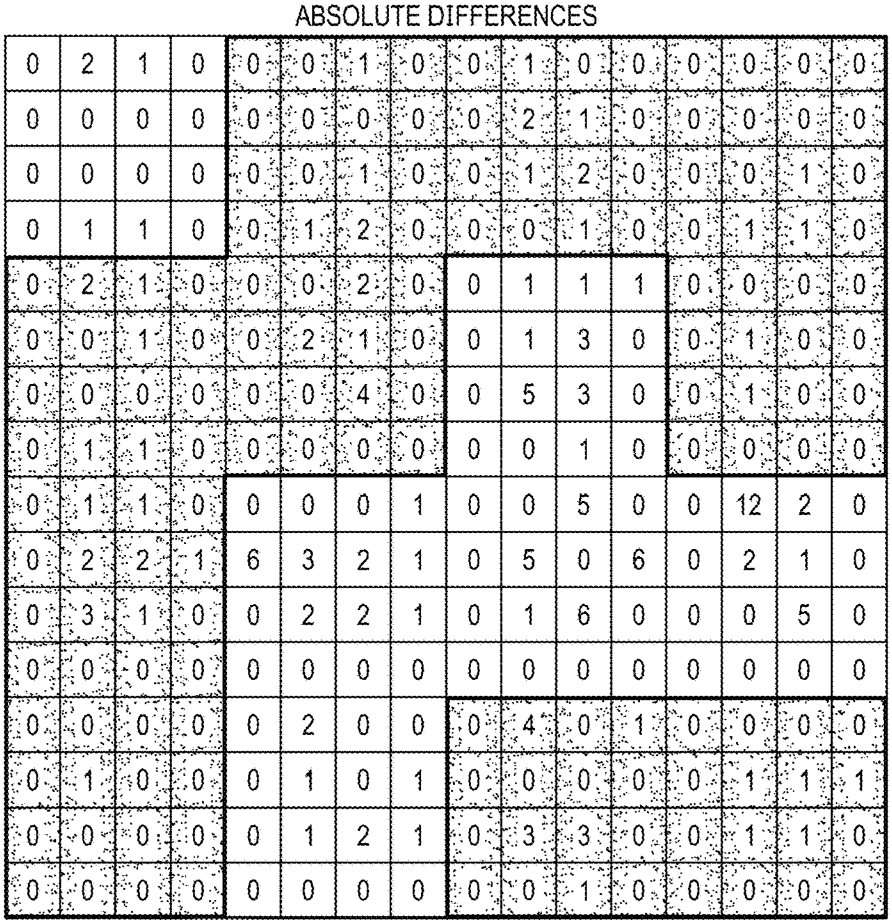
FIG. 17 is a diagram of error metric results for the portion of the image in FIG. 15 due to gradient-based compression in accordance with various examples.

FIG. 17 is a diagram 1700 of error metric results for the portion 1500 of the image in FIG. 15 due to gradient-based compression in accordance with various examples. In the diagram 1700, the absolute difference between pre-gradient compression colors of diagram 1600 of FIG. 16A and post-gradient compression colors of the diagram 1610 of FIG. 16B is shown. Diagram 1700 also shows sub-blocks in which low entropy encoding produces a minimum error.

Figure 18:
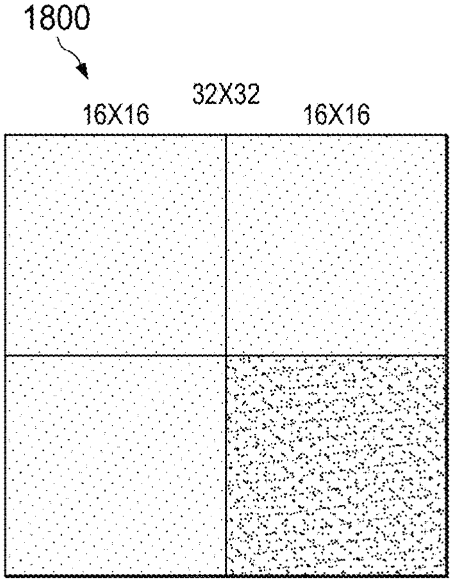
FIG. 18 is a diagram showing neighboring sub-blocks of an image in accordance with various examples.

FIG. 18 is a diagram 1800 showing neighboring sub-blocks of an image in accordance with various examples. In the diagram 1800, a 32×32 portion of an image is shown. The 32×32 portion includes four 16×16 sub-blocks. In some examples, recursive compression operations apply at least some of the compression results of a sub-block to neighboring sub-blocks.

In some examples, recursive compression results in a fixed number of colors of a sub-block being shared over an increased area to reduce the amount of memory needed. In some examples, recursive compression involves: performing PCC analysis based on a target block size/lowest compression ratio; gathering multiple compressed blocks; performing PCC compression on gathered palettes to reduce the palette set for the gathered blocks; performing palette key re-assignment; and applying key compression.

In some examples, the PCC analysis does not perform key compression, but does perform interpolated palette key assignment. The PCC analysis results may include storage of variances, RGB sums, and pixel counts for each cluster. In some examples, PCC compression includes initializing a target number of parent palettes (e.g., 2 parent palettes). For example, a first parent palette closest to an origin (e.g., the dimmest) may be initialized as well as a second parent palette furthest away from the first parent palette. PCC compression may also include: traversing through a gathered palette list in a high frequency random order (not repeating from a block until all have been exhausted); and performing K-means clustering assignments. When adding to a cluster, pixel counts and sums from the original, gathered palettes may be used. PCC compression may also include iterating on the palette data to achieve steady state, randomizing traversal order; summing together variances of combined clusters; and using splitting parent clusters to break up clusters larger than a threshold. In some examples, PCC compression includes repeating cluster assignments and splitting operations until a target number of palettes is derived. The result of applying key compression is that the original palette list for pixel data is substituted with a reduced palette list.

FIGS. 19 to 23 are tables 1900, 2000, 2100, 2200, and 2300 showing palette compression analysis metrics in accordance with various examples. Example analysis palette compression analysis metrics include RGB values for gathered palettes, cluster variances and photopic-weighted variances. Table 1900 of FIG. 19 shows RGB values for gathered palettes including a dimmest palette and a furthest from dimmest palette. Table 1900 also shows cluster variances and photopic-weighted variances for the gathered palettes. In some examples, a dimmest palette and a furthest from dimmest palette such as those identified in table 1900 are used to initialize two parent clusters.

In table 2000 of FIG. 20, the gathered palettes, the cluster variances, and the photopic-weighted variances of the table 1900 are assigned to the two parent clusters. After a number of data passes or iterations (e.g., 4 iterations in the example of FIG. 20) of parent clustering, centroid RGB values for the parent clusters are determined along with parent cluster variances and photopic-weighted variances.

Figure 21:
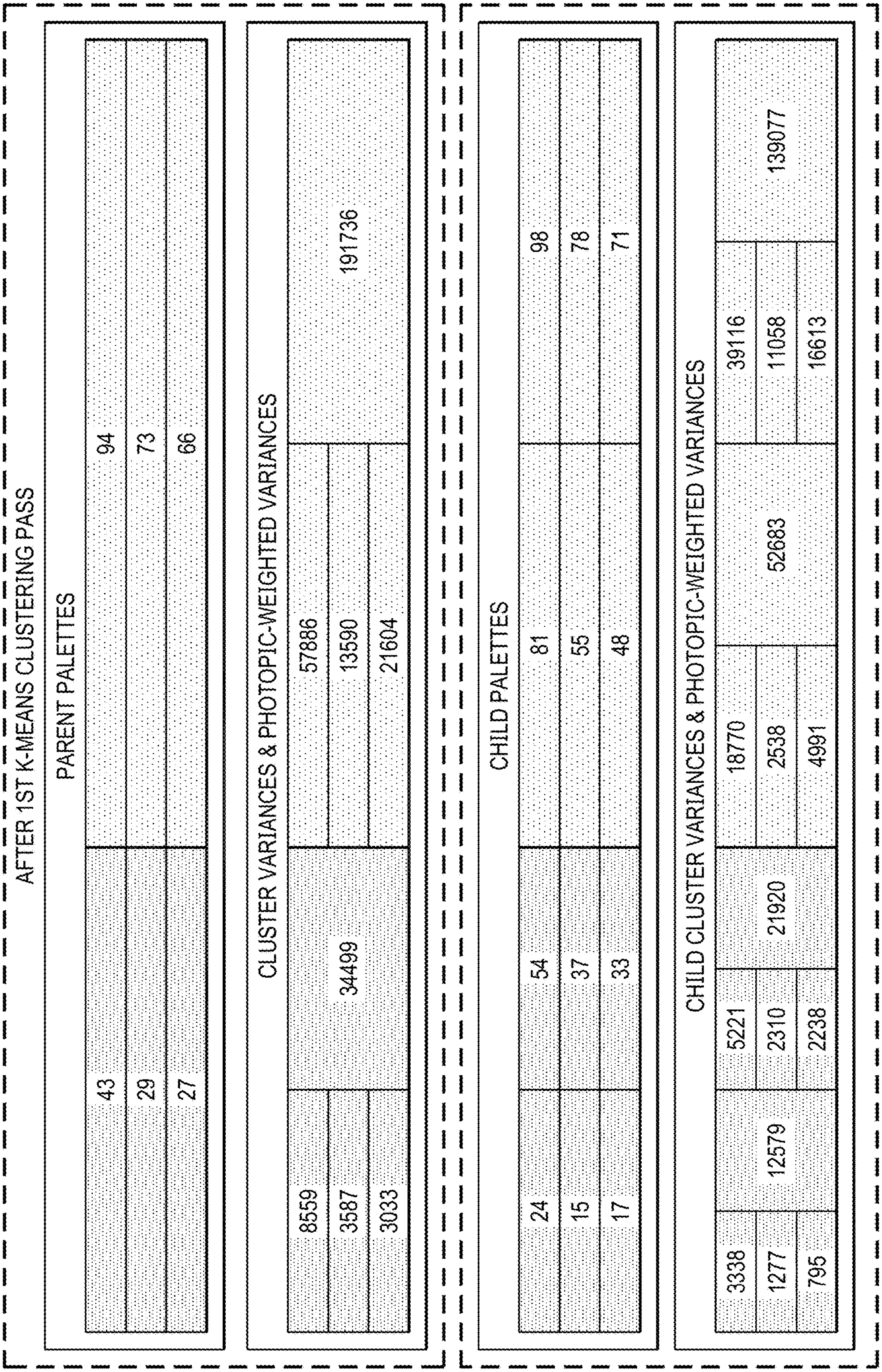

In table 2100 of FIG. 21, the centroid RGB values, the cluster variances, and the photopic-weighted variances for the two parent cluster of the table 2000 are shown. After a $1^{st}$ K-means clustering pass, each of the two parents clusters is split into respective child clusters. In some examples, the parent cluster with the largest variance is split into child clusters first. Table 2100 also includes centroid RGB values, cluster variances, and photopic-weighted variances for each of the child clusters resulting from the $1^{st}$ K-means clustering pass. If the variance of a resulting child cluster is greater than the variance of one of the parent clusters, the K-means clustering process may stop before the next pass.

Figure 22:
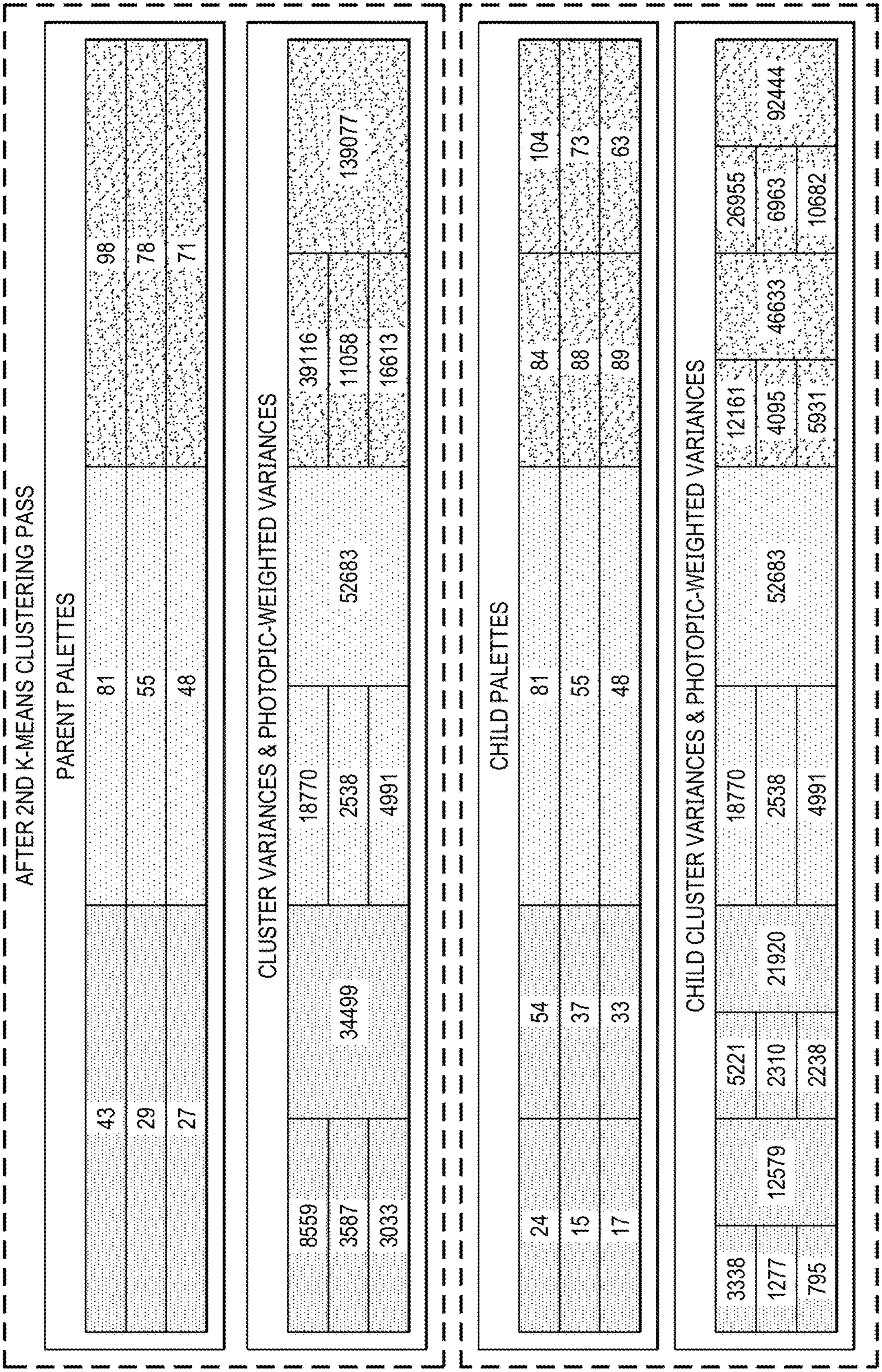

In table 2200 of FIG. 22, the centroid RGB values, the cluster variances, and the photopic-weighted variances for three parent clusters are shown. In table 2200, the three parent clusters are the result of the largest parent cluster of table 2100 being split into two clusters. In table 2200, RGB values, child cluster variances, and photopic-weighted variances are shown for child clusters after a $2^{nd}$ K-means clustering pass. More specifically, the $2^{nd}$ K-means clustering pass results in two of the three parent clusters being split, resulting in five clusters. In some example, a parent cluster may have only one original palette assigned to it. In such case, child clusters are not created by the K-means clustering pass.

Figure 23:
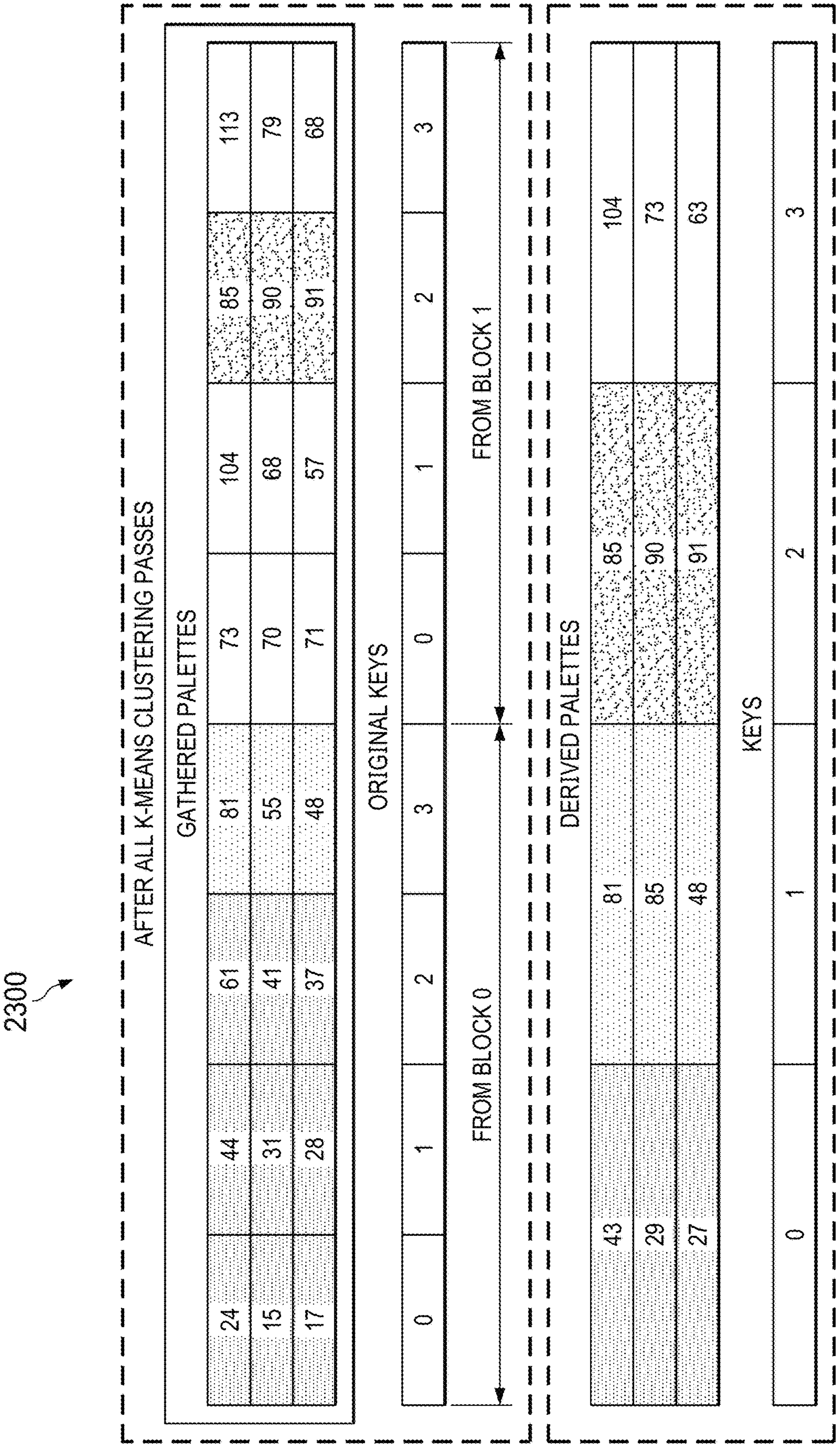

In table 2300 of FIG. 23, centroid RGB values, cluster assignments, and keys are shown for the original gathered palettes of table 1900. Centroid RGB values and keys are also shown for four derived palettes after all K-means clustering passes. In the example of FIG. 23, the gathered palettes are related to two blocks, block 0 and block 1. In some examples, the encoding of keys for image blocks, such as block 0 and block 1, is simplified to reduce the memory needed. In the example of FIG. 23, blocks 0 and 1 are example sub-blocks that are spatially adjacent to each other. Initially, the main palettes for blocks 0 and 1 are created separately. During recursive compression operations, the palettes for blocks and 1 are aggregated and the palette set is further reduced. In table 2300, the number of keys used to encode block 0 and block 1 is reduced from 8 keys, to 5 keys, to 4 keys, which increases the compression ratio.

Figure 24:
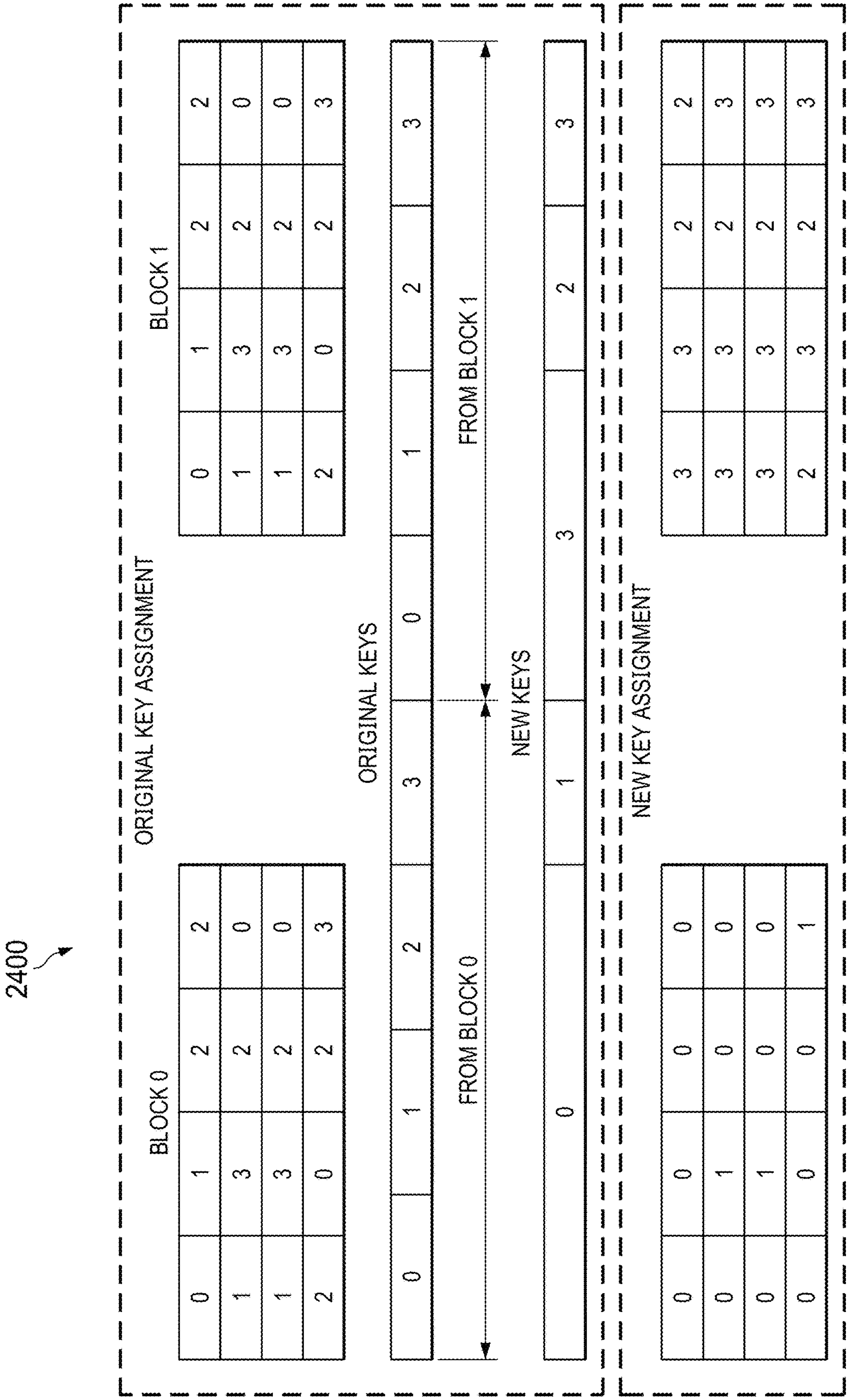
FIG. 24 is a diagram showing palette key re-assignment in accordance with various examples.

FIG. 24 is a diagram 2400 showing palette key re-assignment in accordance with various examples. In the diagram 2400, original key assignments for block 0 and block 1 are shown. After a K-means clustering process as described herein, key re-assignments are performed for block 0 and block 1.

Figure 25:
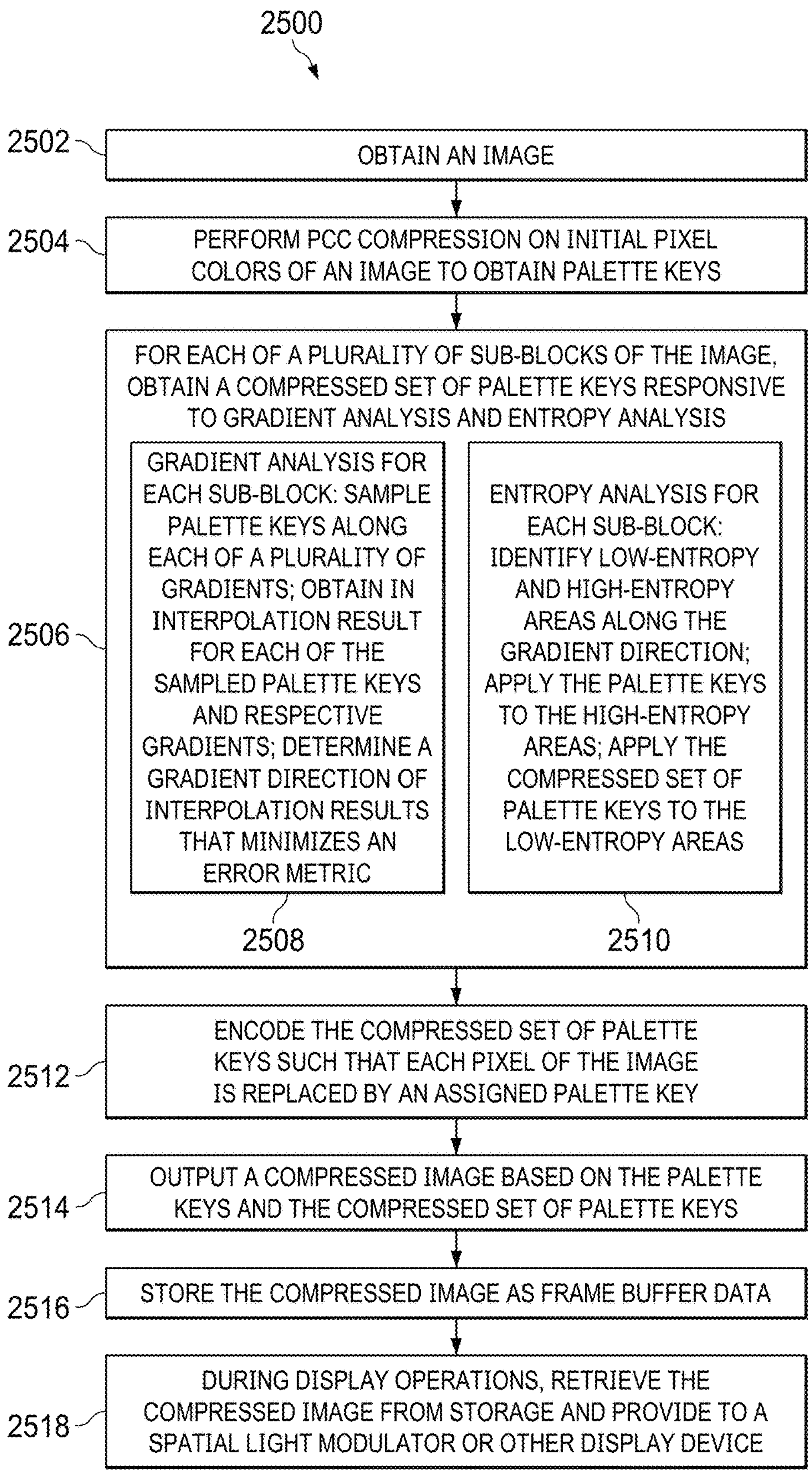
FIG. 25 is a method in accordance with various examples.

FIG. 25 is a method 2500 in accordance with various examples. The method 2500 is performed by a controller, such as the controller 102 of FIG. 1A. As another option, a controller may perform blocks 2516 and 2518, and another IC perform blocks 2502, 2504, 2506, 2512, and 2514. As shown, the method 2500 includes obtaining an image at block 2502. At block 2504, a first compression (e.g., PCC compression) is performed on initial pixel colors of the image to obtain palette keys. At block 2506, a compressed set of palette keys is obtained, for each of a plurality of sub-blocks of the image, responsive to gradient analysis and entropy analysis. In other words, the operations of block 2506 perform a second compression based on gradient analysis and entropy analysis. In some examples, the second compression of block 2506 has a different compression ratio relative to the first compression of block 2504. In some examples, the first compression compresses initial colors of an image to a compressed set of colors, and the second compression compresses key assignments for the compressed colors and/or key assignment for a partially decompressed set of compressed colors. In such examples, the first compression may have a greater compression ratio than the second compression. In the example of FIG. 25, the first and second compressions of blocks 2504 and 2506 are performed sequentially, and the second compression further compresses the results of the first compression. In other examples, the first and second compressions of blocks 2504 and 2506 may be performed in another order or together. The results of first and second compressions may be applied to different portions of the image. Also, decompression options may involve partially or fully decompression the first compression and/or the second compression.

In the example of FIG. 25, blocks 2508 and 2510 are steps included in the second compression of block 2506. More specifically, block 2508 shows operations of the gradient analysis of block 2506, and block 2510 shows operations of the entropy analysis of block 2506. As shown in block 2508, the gradient analysis for each sub-block may include: sampling palette keys along each of a plurality of gradients; obtaining an interpolation result for each of the sampled palette keys and respective gradients; and determining a gradient direction of interpolation results that minimizes an error metric. Example gradient analysis operations that may be performed in block 2508 and related results are described in FIGS. 13 to 16B. As shown in block 2510, the entropy analysis for each sub-block may include: identifying low-entropy areas and high-entropy areas along the gradient direction; applying the palette keys to the high-entropy areas; and applying the compressed set of palette keys to the low-entropy areas. In some examples, identifying low-entropy areas and high-entropy areas along the gradient direction as in block 5210 includes: identifying areas along the gradient direction that have an entropy below a threshold are identified as low-entropy areas; and identifying areas along the gradient direction having an entropy above the threshold are identified as high-entropy areas. Example entropy analysis operations that may be performed in block 2510 may result in different compression levels being applied to low-entropy and high-entropy portions of an image or sub-block as represented in FIG. 17.

After obtaining the compression results of the first compression of block 2504 and the second compression of block 2506, the method 2500 may include encoding the compressed set of palette keys such that each pixel of the image can be replaced by an assigned palette key at block 2512. The assigned palette keys may be based on the first compression, the second compression, or both (e.g., if the second compression is applied to the results of the first compression). At block 2514, a compressed image is output based on the palette keys and the compressed set of palette keys. In some examples, the compressed image is stored as frame buffer data (e.g., frame buffer data 118) at block 2516. For example, the compressed image may be based on the palette keys (e.g., for high-entropy areas) and the compressed set of palette keys (e.g., for low-entropy areas). During display operations at block 2518, the compressed image is retrieved from storage and provided to a spatial light modulator (e.g., the spatial light modulator 128 in FIG. 1A) or other display device. In some examples, the method 2500 may include decompressing the compressed image and storing the decompressed image as frame buffer data at block 2516. As another option, block 2518 may include decompressing the retrieved compressed image, and providing the decompressed image to the spatial light modulator or other display device.

With the method 2500, the pixels of an image are replaced with cluster centroids as described herein. Replacing the pixels of an image with cluster centroids is a first compression option to produce a compressed image. A second compression option that can be applied, in addition to or instead of the first compression option, is palette key compression as described herein. Any suitable type of display can be used to display the compressed image, such as a digital micromirror device (DMD), a liquid crystal display (LCD), light emitting diode (LED) display, thin-film transistor (TFT), liquid crystal on silicon (LCoS), or any other display.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

The invention claimed is:

1. A system comprising:

a controller configured to:

perform parent-child cluster compression on initial pixel colors of an image including apply a weighted cluster variance calculation that applies different weights to red, green, and blue variances, and reduce the initial pixel colors to palette keys responsive to the parent-child cluster compression; and for each of a plurality of sub-blocks of the image, obtain a compressed set of palette keys responsive to gradient analysis and entropy analysis; and a spatial light modulator coupled to the controller and configured to project an image based on the palette keys and the compressed set of palette keys.

2. The system of claim 1, further configured to perform gradient analysis for each sub-block by:

sampling the palette keys along each of a plurality of gradients;

obtaining an interpolation result for each of the sampled palette keys and respective gradients; and determining a gradient direction of interpolation results that minimizes an error metric.

3. The system of claim 2, further configured to determine the error metric based on a sum of absolute difference of interpolation results along a gradient relative to the palette keys.

4. The system of claim 3, further configured to determine the error metric based on a maximum absolute difference of interpolation results along a gradient relative to the palette keys.

5. The system of claim 2, further configured to perform entropy analysis for each sub-block by:

identifying areas along the gradient direction having an entropy below a threshold as low-entropy areas; and identifying areas along the gradient direction having an entropy above the threshold as high-entropy areas.

6. The system of claim 5, further configured to:

apply the palette keys to the high-entropy areas; and apply the compressed set of palette keys to the low-entropy areas, the compressed set of palette keys based on a first set of bits that identify colors of the compressed set of palette keys, a second set of bits that identify a number of colors per sub-block, and a third set of bits that identify the gradient direction.

7. The system of claim 1, further configured to obtain the palette keys by:

performing the parent-child cluster compression on initial pixel colors of the image, wherein the parent-child cluster compression includes determining a nearest cluster for each pixel of the image based on a weighted absolute difference sum calculation that applies different weights to red, green, and blue absolute difference sums; and reducing the initial pixel colors to the palette keys responsive to the parent-child cluster compression.

8. A controller comprising:

a processor; and memory coupled to or included with the processor, the memory storing compression instructions that, when executed, cause the processor to:

obtain an image;

perform parent-child cluster compression on initial pixel colors of the image to obtain palette keys;

perform gradient analysis for each of a plurality of sub-blocks, including sample the palette keys along each of a plurality of gradients, and obtain an interpolation result for each of the sampled palette keys and respective gradients;

for each of the plurality of sub-blocks of the image, obtain a compressed set of palette keys responsive to the gradient analysis and entropy analysis; and output a compressed image based on the palette keys and the compressed set of palette keys.

9. The controller of claim 8, wherein the compression instructions, when executed, further cause the processor to perform gradient analysis for each sub-block by:

determining a gradient direction of interpolation results that minimizes an error metric.

10. The controller of claim 9, wherein the compression instructions, when executed, further cause the processor to determine the error metric based on a summed absolute difference of interpolation results along a gradient relative to the palette keys.

11. The controller of claim 10, wherein the compression instructions, when executed, further cause the processor to determine the error metric based on a maximum absolute difference of interpolation results along a gradient relative to the palette keys.

12. The controller of claim 9, wherein the compression instructions, when executed, further cause the processor to perform entropy analysis for each sub-block by:

identifying areas along the gradient direction having an entropy below a threshold as low-entropy areas; and identifying areas along the gradient direction having an entropy above the threshold as high-entropy areas.

13. The controller of claim 12, wherein the compression instructions, when executed, further cause the processor to:

apply the palette keys to the high-entropy areas; and apply the compressed set of palette keys to the low-entropy areas, the compressed set of palette keys based on a first set of bits that identify colors of the compressed set of palette keys, a second set of bits that identify a number of colors per sub-block, and a third set of bits that identify the gradient direction.

14. The controller of claim 8, wherein the compression instructions, when executed, further cause the processor to obtain the palette keys for the image by determining a nearest cluster for each pixel of the image based on a weighted absolute difference sum calculation that applies different weights to red, green, and blue absolute difference sums.

15. The controller of claim 14, wherein the compression instructions, when executed, further cause the processor to obtain the palette keys for the image by:

determining a weighted variance for each of a plurality of clusters based on a weighted variance calculation that applies different weights to red, green, and blue variances, the plurality of clusters including parent clusters and child clusters; and selectively splitting clusters based on a weighted variance improvement score that compares the weighted variance of each parent cluster with an average weighted variance of respective child clusters.

16. The controller of claim 8, wherein the compression instructions, when executed, further cause the processor to selectively apply at least some of the compressed set of palette keys for one of the plurality of sub-blocks to another portion of the image based on a recursive algorithm that includes:

performing the parent-child cluster compression based on a target sub-block size to compression ratio;

performing palette key re-assignment responsive to the parent-child cluster compression; and applying a key compression that substitutes an initial palette list for the image with pixel data.

17. A method comprising:

obtaining, by a controller, an image;

performing, by the controller, a first compression on initial pixel colors of the image to obtain palette keys;

for each of a plurality of sub-blocks of the image, performing a second compression to obtain a compressed set of palette keys, the first compression and the second compression having different compression ratios, wherein performing the second compression includes sampling the palette keys along each of a plurality of gradients, determining a gradient direction based on results of the sampling, identifying areas along the gradient direction having an entropy below a threshold as low-entropy areas, and identifying areas along the gradient direction having an entropy above the threshold as high-entropy areas; and outputting, by the controller, a compressed image based on the palette keys and the compressed set of palette keys.

18. The method of claim 17, wherein performing the second compression includes:

obtaining an interpolation result for each of the sampled palette keys and respective gradients; and determining the gradient direction that minimizes an error metric.

19. The method of claim 18, wherein performing the second compression includes:

applying the palette keys to the high-entropy areas; and applying the compressed set of palette keys to the low-entropy areas.

* * * * *